United States Patent
Fung et al.

(10) Patent No.: US 11,784,637 B1
(45) Date of Patent: Oct. 10, 2023

(54) EDGE DETECTION CIRCUIT

(71) Applicant: Cambridge GaN Devices Limited, Cambridge (GB)

(72) Inventors: Sheung Wai Fung, Cambridge (GB); Loizos Efthymiou, Cambridge (GB); Florin Udrea, Cambridge (GB); Martin Arnold, Cambridge (GB)

(73) Assignee: CAMBRIDGE GAN DEVICES LIMITED, Cambridge (GB)

( * ) Notice: Subject to any disclaimer, the term of this patent is extended or adjusted under 35 U.S.C. 154(b) by 0 days.

(21) Appl. No.: 17/740,953

(22) Filed: May 10, 2022

(51) Int. Cl.
*H03K 5/00* (2006.01)
*H03K 5/1534* (2006.01)
*H03K 5/1252* (2006.01)
*H03K 5/1536* (2006.01)

(52) U.S. Cl.
CPC ......... *H03K 5/1534* (2013.01); *H03K 5/1252* (2013.01); *H03K 5/1536* (2013.01)

(58) Field of Classification Search
CPC ... H03K 5/1534; H03K 5/1252; H03K 5/1536
See application file for complete search history.

(56) References Cited

U.S. PATENT DOCUMENTS

| | | | | | |
|---|---|---|---|---|---|
| 4,246,494 | A | * | 1/1981 | Foreman | H05B 39/085 307/157 |
| 4,480,200 | A | * | 10/1984 | Tan | H03K 5/08 327/78 |
| 4,771,219 | A | * | 9/1988 | Ludolf | H04B 10/502 327/170 |
| 4,945,441 | A | * | 7/1990 | Kaneko | G01R 19/175 360/137 |
| 5,623,218 | A | * | 4/1997 | Kim | H03K 5/1534 327/335 |
| 5,929,618 | A | * | 7/1999 | Boylan | H02J 1/102 323/289 |
| 7,800,434 | B1 | * | 9/2010 | Wong | H03K 5/003 327/24 |
| 2012/0319743 | A1 | * | 12/2012 | Morishita | H04L 25/0276 327/110 |
| 2022/0247216 | A1 | * | 8/2022 | Alam | H02J 50/12 |

* cited by examiner

*Primary Examiner* — Tuan T Lam
(74) *Attorney, Agent, or Firm* — Tarolli, Sundheim, Covell & Tummino, LLP

(57) ABSTRACT

The present disclosure relates to an edge detection circuit configured to receive an input signal comprising one or more falling or falling edges and provide an output signal comprising pulses or spikes corresponding to the one or more rising or falling edges. The edge detection circuit comprises a passive differentiator circuit configured to receive an input and provide a differentiator output signal that that is proportional to the rate of change of the input, and a comparator circuit operably connected to a voltage source. The comparator circuit is configured to receive the differentiator output signal, compare the differentiator output signal to a threshold voltage; and output a pulse or spike signal based on the comparison to the threshold voltage.

20 Claims, 16 Drawing Sheets

EDGE DETECTION CIRCUIT

TECHNICAL FIELD OF THE DISCLOSURE

The present disclosure relates to edge detection circuits, and in particular to edge detection circuits suitable for use in analogue circuits.

BACKGROUND OF THE DISCLOSURE

The present disclosure generally provides an edge detection circuit suitable for use in analogue and digital circuits. Edge detection circuits may be configured to detect rising and/or falling edges of an input signal. A rising edge of a signal corresponds to an increase in the signal from an initial value (e.g. 0) to a higher value (e.g. 1), while a falling edge of a signal corresponds to a decrease in the signal from an initial value (e.g. 1) to a lower value (e.g. 0). A rising edge of a signal is commonly referred to as a positive edge, while a falling edge of a signal is commonly referred to as a negative edge. Generally, an edge detector circuit may be configured to produce an output signal, such as an output pulse or an output spike signal, when an edge is detected. For example, a positive edge detection circuit (i.e. an edge detection circuit configured to detect a rising edge) may be configured to receive an input signal (such as a square wave) and output a pulse signal whenever a selected edge (i.e. a rising edge) is detected, while producing no output signal for non-selected edges (i.e. falling edges).

In known analogue edge detection circuits, edge detection is generally implemented through the use of differentiator circuits. An ideal differentiator circuit may provide an output that is proportional to the rate of change (i.e. the time derivative) of the input signal. Such edge detection circuits generally comprise a capacitor or capacitors connected in series with the input signal and one or more operational amplifiers.

Such operational amplifiers require the use of p-channel devices, such as PMOS. However, in many developing technological areas, such as integrated circuits comprising III-nitride compounds (e.g. AlGaN and/or GaN devices) as a base semiconductor material, suitable p-channel devices are not technologically mature enough to be available with the necessary volume production levels.

Some implementations of known edge detection circuits may comprise additional components to provide some resistance against input signal noise, such as a resistor providing negative feedback. These differentiator circuits (commonly referred to as "real" or "practical" differentiator circuits) may generally be configured to provide a frequency dependent gain, with the gain increasing from unity at a first frequency $f_1$ to a maximum gain value at a second, higher frequency $f_2$, before decreasing at frequencies above the second frequency $f_2$. Thus, high frequency input signals (e.g. with a frequency $f_3 \gg f_2$), such as many noise signals, produce a reduced or no gain. This enables the edge detection circuits to detect the rising and/or falling edges of an input signal while rejecting high frequency noise signals.

However, while these differentiator circuits benefit from a reduction in false triggering events (e.g. from detecting the rising and/or falling edges of input signal noise), they inherently provide a reduced bandwidth, as higher and lower frequency input signals may fail to trigger an output of the edge detection circuits at all.

The Applicant has therefore recognised a need for improved edge detection circuits addressing these and other disadvantages associated with known edge detection circuits.

SUMMARY

In general, aspects of the present disclosure may provide an edge detection circuit suitable for use in analogue and digital circuits. In particular, the present disclosure provides edge detection circuits that do not utilise an operational amplifier, such that the edge detection circuit does not require the use of p-channel devices, and/or edge detection circuits that may reduce false triggering events from low amplitude signals such as noise. Thus, an edge detection circuit according to the present disclosure may be incorporated into e.g. integrated circuits comprising III-nitride compounds as the base semiconductor material.

Thus, according to a first aspect of the invention there is provided a falling edge detection circuit configured to receive an input signal comprising one or more falling edges and provide an output signal comprising pulses or spikes corresponding to the one or more falling edges, wherein the edge detection circuit comprises:

a passive differentiator circuit configured to receive an input and provide a differentiator output signal that that is proportional to the rate of change of the input; and a comparator circuit operably connected to a voltage source, wherein the comparator circuit is configured to:
  receive the differentiator output signal;
  compare the differentiator output signal to a threshold voltage; and
  output a pulse or spike signal when the differentiator output signal is less than the threshold voltage.

According to a second aspect of the invention, there is provided a rising edge detection circuit configured to receive an input signal comprising one or more rising edges and provide an output signal comprising pulses or spikes corresponding to the one or more rising edges, wherein the edge detection circuit comprises:

a passive differentiator circuit configured to receive an input and provide a differentiator output signal that that is proportional to the rate of change of the input; and a comparator circuit operably connected to a voltage source, wherein the comparator circuit is configured to:
  receive the differentiator output signal;
  compare the differentiator output signal to a threshold voltage; and
  output a pulse or spike signal when the differentiator output signal is greater than the threshold voltage.

It will be understood that the threshold voltage of the rising and falling edge detection circuits of the present disclosure may be positive or negative. For a positive threshold voltage, the phrases "greater than" and "less than" may respectively refer to a signal being more or less positive than the threshold voltage, i.e. such that an input signal of +5V is considered to be more positive or "greater than" a threshold voltage of +2V. Similarly, for a negative threshold voltage, the phrases "greater than" and "less than" may respectively refer to a signal being less or more negative than the threshold voltage, i.e. such that an input signal of −5V would be considered to be "less than" a threshold voltage of −2V. In implementations, a rising edge detection circuit may comprise a positive threshold voltage. In other implementations, a falling edge detection circuit may comprise a negative threshold voltage.

For both rising and falling edge detection circuits of the present disclosure, the passive differentiator circuit may be configured to receive an input signal and provide an output (i.e. a differentiator output signal) with a magnitude that is proportional to the rate of change of the input signal, such that rising or falling edge in the input signal result in a pulse or spike in the differentiator output signal. In implementations, the differentiator output signal and the rate of change of the input signal may have the same sign. In other words, the passive differentiator circuit may be configured such that a falling edge (also called a negative edge) of the input signal results in a negative pulse or spike in the differentiator output signal, and a rising edge (also called a positive edge) of the input signal results in a positive pulse or spike in the differentiator output signal.

The resistor or resistive element of the passive differentiator circuit may be a 2DEG resistor or a metal resistor. In implementations, the resistive element of the passive differentiator circuit may be replaced by other suitable components, such as a current source. The current source may be based on a depletion mode high electron mobility transistors (HEMT) and a resistive element.

The capacitor or the resistive element of the passive differentiator could be connected to a transistor such as a HEMT in parallel. This transistor may be controlled by other elements of an integrated circuit and/or a system configured to activate and deactivate the edge detector.

The edge detection circuits of the present disclosure may be configured as either a rising or falling edge detection circuit based on the design of the comparator circuit. For example, in implementations the comparator circuit may be configured to determine whether the magnitude of the differentiator output signal is greater than a threshold voltage and provide an output spike or pulse only when the magnitude of the differentiator output signal is determined to be greater than the threshold voltage. Such a configuration may facilitate the detection of rising edges in the input signal, as a suitably chosen threshold voltage (such as a positive threshold voltage) will result in only (sufficiently large) positive pulses or spikes in the differentiator output signal triggering an output pulse or spike from the comparator circuit. Therefore, as well as facilitating the selection of the rising or falling edges, the threshold voltage may be set at a value such that small amplitude rises in the input signal (e.g. resulting from input signal noise) do not trigger an output spike or pulse from the comparator circuit.

In implementations, a comparator circuit for a rising edge detection circuit may comprise an inverter stage, the inverter stage comprising at least one enhancement mode transistor (such as an enhancement mode HEMT) and a pull-up component. The pull-up component may be any suitable component for providing a known state for the signal, such as a resistor or a current source. The use of a pull-up current source may result in an improvement in the speed/power dissipation trade-off of the inverter stage.

Alternatively, the comparator circuit may be configured to determine whether the magnitude of the differentiator output signal is less than a threshold voltage and provide an output spike or pulse only when the magnitude of the differentiator output signal is determined to be less than the threshold voltage. Such a configuration may facilitate the detection of falling edges in the input signal, as a suitably chosen threshold voltage (such as a negative threshold voltage) will result in only (sufficiently large) negative pulses or spikes in the differentiator output signal triggering an output pulse or spike from the comparator circuit. Therefore, as well as facilitating the selection of the rising or falling edges, the threshold voltage may be set at a value such that small amplitude dips in the input signal (e.g. resulting from input signal noise) do not trigger an output spike or pulse from the comparator circuit. In such implementations, the comparator circuit for a falling edge detection circuit may comprise an inverter stage, the inverter stage comprising at least one depletion mode transistor (such as a depletion mode HEMT) and a pull-up component. The pull-up component may be any suitable component for providing a known state for the signal, such as a resistor or a current source. The use of a pull-up current source may result in an improvement in the speed/power dissipation trade-off of the inverter stage.

It will be appreciated that, in general, the determining factor between the rising and falling edge detection circuits of the present disclosure is whether the comparator circuit selects spike signals from the differentiator output signal that are above or below the threshold voltage. Therefore, all implementations discussed herein that do not directly relate to this selection of the spike signals by the comparator circuit apply equally to both the rising and falling edge circuits of the present disclosure. The selection of the spike signals may be defined as a change in the output of the comparator circuit being observed when a spike signal from the differentiator output signal crosses the threshold voltage (also commonly called a reference voltage) level of the comparator circuit.

The use of an inverter stage in the comparator circuit may invert the output spike or pulse relative to the input signal. In other words, a positive pulse or spike in the differentiator output signal (due to e.g. a rising or positive edge of the input signal) may trigger a negative output pulse or spike in the output signal from the comparator circuit, and vice versa.

To provide an output signal from the comparator circuit with the same sign as the differentiator output signal, the comparator circuit may comprise a two stage inverter. The two inverter stages may comprise enhancement mode or depletion mode transistors and pull-up components as described above. For example, the two stage inverter circuit may comprise a first inverter stage whose output is connected to the gate of a transistor or HEMT, where the transistor or HEMT is connected in parallel with the current source of the second inverter stage. Thus, the output of the first inverter stage may be configured to drive the gate of a transistor connected in parallel with the pull-up component of the second stage inverter. A comparator circuit comprising a two stage inverter may enhance the detection speed of the edge detection circuit at a cost of higher power consumption. Additional inverter stages may be included to further enhance operational speeds.

Thus, the output signal of the comparator circuit may be inverted or non-inverted compared to the input.

It will be understood that the threshold voltage of the comparator circuit may also be referred to as a reference voltage or a comparator reference voltage, and this terminology is commonly used in literature. In implementations, the threshold voltage of the comparator circuit may be set by a fixed reference voltage applied externally, or, in the case of an integrated circuit, generated on the chip. Alternatively, in implementations of the comparator circuit comprising a transistor, such as a comparator circuit comprising an inverter stage, the threshold voltage of the comparator circuit may be the threshold voltage of the enhancement/depletion mode transistor.

In implementations, the output signal of the comparator circuit may be amplified. The amplified output signal of the comparator circuit may be inverted or non-inverted compared to the input.

In an implementation, the output of the comparator circuit may be the output of the edge detection circuit. This comparator circuit may be configured to provide this output as a voltage signal or as a current signal. For example, the output signal from the edge detection circuit may be defined as the presence or absence of a low resistance path to ground from the node where the output terminal of the edge detection circuit is connected, resulting a characteristic current output when the selected edge is detected. These examples may lead to higher power consumption if the node where a low resistance path to ground is provided can draw a significant current.

In an implementation, the edge detection circuit may comprise one or more amplifier stages configured to receive a differential input signal. The amplifier stage(s) may be located between the passive differentiator circuit stage and the comparator circuit stage, or may otherwise be incorporated into the passive differentiator stage or the comparator stage.

The amplifier stage(s) may comprise a differential amplifier stage. The input signal for the differential amplifier stage may be the output of the passive differentiator circuit (e.g. acting as one input voltage (e.g. $V_{in+}$)) minus a fixed voltage reference (e.g. acting as a second input voltage (e.g. $V_{ref2}$)). The reference voltage may be applied externally, or, for example in the case of some integrated circuits, generated on the integrated circuit chip as described above. The differential amplifier stage may output an amplified differential output signal which can be provided as a differential input signal to the next stage in the edge detection circuit.

The one or more of the amplifier stages may additionally or alternatively comprise a transconductance amplifier stage. In implementations comprising both a transconductance amplifier stage and a differential amplifier stage, the transconductance amplifier stage may be configured to receive an input signal (e.g. a differential input voltage or other differential amplifier output signal) from the differential amplifier stage and provide a differential current output.

The edge detection circuit may comprise a current subtractor stage configured to receive the differential output current from the transconductance amplifier stage as an input, and set the comparator output based on the sign of the current subtraction of its inputs. In implementations, the subtractor stage may be incorporated into the comparator stage. As such, in implementations the comparison of the differentiator output signal and the threshold voltage may comprise current subtraction by the current subtractor stage, for example of two current signals comprising the differential output current.

In some of the implementations described above the differential amplifier and transconductance amplifier stages may be implemented using at least one differential amplifier pair (also known as long-tailed pair). Additionally or alternatively, the current subtractor stage may be implemented using at least one current-mirror. Other configurations of the differential amplifier, transconductance amplifier, and current subtractor stages also fall within the scope of the present disclosure.

In implementations, the differential amplifier, transconductance amplifier, and current subtractor may be incorporated into the comparator circuit stage. The comparator circuit stage in this implementation may comprise an applied (e.g. fixed) reference voltage for use as the threshold voltage as described above. Advantageously, the incorporation of the amplifier stage(s) and/or current subtractor stage into the edge detection circuit and/or the comparator stage may therefore facilitate adjustments to the threshold voltage, as in these implementations the threshold voltage may be set at a desired level by adjusting the reference voltage applied.

It will be understood that other considerations for the choice of a suitable comparator circuit configuration may include for example power dissipation, area on wafer, common mode rejection ratio, and the response time.

As briefly mentioned, any real world input signal to the edge detection circuit may comprise small amplitude dips or rises, for example resulting from signal noise. As briefly described above, the threshold voltage of the comparator circuit may be set at a level sufficient to reduce or eliminate some or all false triggering events resulting from this noise. Nevertheless, in implementations it is desirable to provide additional protection against potential false triggering events that may result from the detection of the rising or falling edges of these small amplitude dips or rises.

Thus, in implementations the edge detection circuit may comprise a voltage reference circuit. The edge detection circuit may be configured to provide a voltage reference output signal as the input to the passive differentiator circuit.

In some implementations, the voltage reference circuit is configured to determine whether the input signal is less than a set voltage reference and provide a rising or falling edge in the voltage reference output signal when the input signal at the time of the rising or falling edge is determined to be less than the set voltage reference. This determination may be based on e.g. an amplitude or magnitude of the input signal. This type of voltage reference circuit may be referred to as a low-pass voltage reference circuit. It will be understood that the phrase "low-pass" in the context of the voltage reference circuit refers to an amplitude or magnitude of the input signal, rather than e.g. a frequency of the input signal.

In other implementations, the voltage reference circuit may be configured to determine whether the input signal is greater than the set voltage reference and provide a rising or falling edge in the voltage reference output signal when the input signal at the time of the rising or falling edge is determined to be greater than the set voltage reference. This determination may be based on e.g. an amplitude or magnitude of the input signal. This type of voltage reference circuit may be referred to as a high-pass voltage reference circuit. It will be understood that the phrase "high-pass" in the context of the voltage reference circuit refers to an amplitude or magnitude of the input signal, rather than e.g. a frequency of the input signal.

Edge detection circuits comprising a voltage reference circuit therefore comprise a voltage reference level below which or above which (depending on the implementation) it does not detect edge signals (whether rising or falling) in the input signal, in order to improve noise immunity and reduce false triggering events. For example, in a low-pass voltage reference circuit, if the input voltage is above the set voltage reference, the voltage reference circuit will provide an output equal to the set voltage reference and so any rising or falling edges in the input signal above the set voltage reference value will be removed from the signal. Similarly, in a high-pass voltage reference circuit, if the input voltage is below the set voltage reference, the voltage reference circuit will provide a set output (e.g. of 0), and so any rising or falling edges in the input signal below the set voltage reference value will be removed from the signal.

Thus, there may be provided an edge detection circuit comprising a voltage reference circuit connected to the input signal terminal, which is configured to output an edge signal (rising or falling) only when the input signal is at a level above or below a set voltage reference when the edge occurs. The gradient of the output edge signal from the voltage reference circuit may have the same sign as the gradient of the input edge signal. The passive differentiator circuit may be configured to receive the output signal from the voltage reference circuit as an input signal, and may output a spike or pulse signal if an edge signal is detected at its input. A positive spike signal may correspond to the detection of a rising edge signal and a negative spike signal may correspond to the detection of a falling edge signal. The comparator circuit may be connected to a supply voltage terminal, and be configured to receive the spike signal from the passive differentiator circuit and output a signal when the input spike signal crosses a given threshold. The output of the comparator circuit may be connected to the output signal terminal of the edge detection circuit, and the voltage reference circuit, the passive differentiator circuit and the comparator circuit may each be operably connected or comprise a connection to a ground reference terminal.

Therefore, in implementations the voltage reference circuit is configured to output a rising edge signal only when the rising edge in the input signal occurs when the input signal magnitude or amplitude is above a set voltage reference. In alternative implementations, the voltage reference circuit is configured to output a rising edge signal only when the rising edge in the input signal occurs when the input signal magnitude or amplitude is below a set voltage reference.

In further implementations, the voltage reference circuit is configured to output a falling edge signal only when the falling edge in the input signal occurs when the input signal amplitude or magnitude is above a set voltage reference. Alternatively, in some examples the voltage reference circuit is configured to output a falling edge signal only when the falling edge in the input signal occurs when the input signal amplitude or magnitude is below a set voltage reference.

As with the threshold voltage, the set voltage reference may be a positive or negative voltage. The phrases "greater than", "above", "below" and "less than" or equivalents in the context of the set voltage reference may therefore be interpreted in a similar manner to the same phrases within the context of the threshold voltage.

Thus, the voltage reference circuit may be configured to output an edge signal when the input signal comprises an edge signal and is at a level below a set voltage reference. In one implementation, the voltage reference circuit may comprise a current source and a threshold multiplier. The threshold multiplier may be operably connected between the output of the voltage reference circuit and a ground reference. A threshold multiplier may comprise an enhancement mode transistor and a potential divider, where the midpoint of the potential divider is connected to the gate terminal of the enhancement mode transistor. The current source may comprise a depletion mode HEMT and a resistive element. The current source may be connected between the input and the output of the voltage reference circuit. This example of a voltage reference circuit may be particularly suitable when the edge detection circuit operates as a falling or negative edge detection circuit, but is also compatible with a rising or positive edge detection circuit. In an implementation, the voltage reference circuit may comprise a current source and a series of source-gate connected transistors with diode-like characteristics instead of the threshold multiplier. In a further implementation, the voltage reference circuit may comprise a current source and a diode connected to a controlled reference voltage.

Alternatively, the voltage reference circuit may be configured to output an edge signal when the input signal comprises an edge signal and is at a level above a set voltage reference. In one implementation, the voltage reference circuit may comprise a source-gate connected enhancement mode transistor such as a HEMT in series with the input and output of the voltage reference circuit. Therefore, the threshold multiplier may comprise an enhancement mode transistor and a potential divider, where the midpoint of the potential divider is connected to the gate terminal of the enhancement mode transistor. In some implementations, more than one enhancement mode HEMT may be included in this configuration. The threshold voltage of the HEMT and the number of HEMTs chosen may set the voltage reference. Additionally, the voltage reference circuit in this example may comprise an inverter and an enhancement mode HEMT connected between the output of the voltage reference circuit and ground. The gate of the enhancement mode HEMT connected in this manner may be driven by the inverter described. The inverter may be supplied by a primary voltage supply $V_{cc}$, a voltage supply derived from a primary voltage supply $V_{cc}$ or an additional voltage supply. This example of a voltage reference circuit may be most suitable when the edge detection circuit operates as a positive edge detection circuit.

In an additional example, where the voltage reference circuit is configured to output an edge signal when the input signal comprises an edge signal and is at a level above a set voltage reference, the voltage reference circuit may comprise a threshold multiplier, and a current source. The threshold multiplier may be connected between the input and the output of the voltage reference circuit. The current source may be connected between the output of the voltage reference circuit and the ground reference.

For the avoidance of doubt, it is noted that any of the voltage reference circuits described herein may be incorporated into any of the rising and falling edge circuits of the present disclosure.

It will be further understood that the various implementations of the voltage reference circuit, passive differentiator circuit, comparator circuit and/or any additional components described above may be combined as desired to provide a suitable edge detection circuit. For example, the edge detection circuit may comprise two voltage reference circuits connected in series. The first voltage reference circuit may be a high-pass voltage reference circuit with a first set reference voltage, and the second voltage reference circuit may be a low-pass voltage reference circuit with a second set reference voltage. The first and second voltage reference circuits may be configured such that the output of the first voltage reference circuit is provided as an input to the second voltage reference circuit. By suitably selecting the first and second set voltage references such that the first set voltage reference is less than the second set voltage reference, any small amplitude rising or falling edges resulting from e.g. noise in the input signal may be reduced or removed from the final output signal of the two circuits. It will be understood that the ordering of the first and second voltage reference circuits may be reversed, such that the second voltage reference circuit instead provides its output as an input to the first voltage reference circuit.

In implementations, the edge detection circuit may be III-nitride semiconductor based and may be designed as a (fully or partially) monolithically integrated circuit. For example, any one or more of the voltage reference circuit, passive differentiator circuit, comparator circuit and/or any additional components may be provided on a chip to form an or part of an integrated circuit.

The edge detection circuit may comprise an input signal terminal ($V_{in}$), an output signal terminal ($V_{out}$), a supply voltage terminal ($V_{cc}$), and a ground reference. Each of the voltage reference circuit, passive differentiator circuit, comparator circuit may be operably connected to the ground reference, while the supply voltage terminal may provide a voltage source for the comparator circuit. The peak output signal of the edge detection circuit may be equal to the supply voltage ($V_{cc}$).

In implementations of the edge detector circuit, the integrated circuit may comprise enhancement mode and/or depletion mode HEMTs. The HEMTs may comprise an AlGaN/GaN interface where a two-dimensional carrier gas (e.g. two dimensional electron gas also known as 2DEG) is formed. The enhancement mode HEMTs may comprise a pGaN gate. The depletion mode HEMTs may comprise a Schottky gate contact. Other common gate technologies may be used.

The 2DEG may also be used to form resistors for use in the integrated circuit. Resistors may be formed using metal layers in the process. Capacitors may be formed using two metal layers and intermetal dielectrics. Capacitors may also be formed using semiconductor junctions such as junctions formed through doping of the semiconductor, heterojunctions or metal-semiconductor junctions.

In implementations, the edge detection circuit may be monolithically integrated with a Miller clamp and a power transistor. When integrated with a Miller clamp, the output of the edge detection circuit may be configured to control the state of the Miller clamp, and the input signal of the edge detection circuit may be provided by a gate control signal from a controller or a gate driver, such as an external gate driver. For example, the edge detection circuit may be used to drive the gate of an active Miller clamp transistor which is monolithically integrated with a power transistor. The power transistor may be a GaN HEMT with a pGaN gate, or any other suitable power transistor. The active Miller clamp transistor may be an enhancement mode HEMT connected between the gate terminal and the source terminal of the power transistor. The integrated circuit comprising the power transistor, the Miller clamp transistor and the edge detection circuit may additionally comprise a monolithically integrated gate driver or a monolithically integrated gate interface circuit. In these examples, the edge detection circuit input signal may be the input signal of the gate driver or the gate interface circuit. In one such example, where the edge detection circuit may operate as a falling or negative edge detection circuit, such that when the input signal decreases past a given threshold the edge detection circuit outputs a positive spike which can be used to turn-on the enhancement mode Miller clamp transistor.

Thus, in implementations there is provided a Miller clamp system comprising an edge detection circuit according to any of the implementations of the first and/or second aspects of the invention, as described above, for example an edge detection circuit comprising a voltage reference circuit.

In one implementation, the output of the edge detection circuit is operably or directly connected to the gate of the active Miller clamp transistor, and can control the state of the Miller clamp transistor.

In another implementation, the output of the edge detection circuit is operably connected to any circuitry used to drive the active Miller clamp transistor, such that it can be configured to control the state of the Miller clamp transistor indirectly by controlling the output of the circuitry driving the Miller clamp transistor. For example, the output of the edge detection circuit may act on an internal logic signal used to drive the Miller clamp transistor.

According to a third aspect of the invention there is provided a method of detecting an edge of an input signal, the method comprising:

receiving, at a passive differentiator circuit, an input signal comprising one or more rising and/or falling edges;

outputting, from the passive differentiator circuit, a differentiator output signal that is proportional to the rate of change of the input;

receiving, at a comparator circuit, the differentiator output signal;

determining, based on a comparison to a threshold voltage, whether the differentiator output signal corresponds to a rising or falling edge; and outputting, from the comparator circuit, a pulse or spike output signal when the differentiator output signal is determined to correspond to a rising or falling edge.

It will be understood that the additional features and steps described in relation to the devices, systems and apparatus of the present disclosure may be incorporated into the method.

For example, in implementations the method may further comprise:

receiving an input at a voltage reference circuit;

determining whether the input is greater than a set voltage reference; and outputting, from the voltage reference circuit, a voltage reference output signal based on the input, wherein the voltage reference output signal comprises a rising or falling edge when the input comprises a rising or falling edge and the input is determined to be greater than the set voltage reference; and wherein the voltage reference output signal is provided as the input signal to the passive differentiator circuit.

In further implementations, the method may comprise:

receiving an input at a voltage reference circuit;

determining whether the input is less than a set voltage reference; and outputting, from the voltage reference circuit, a voltage reference output signal based on the input, wherein the voltage reference output signal comprises a rising or falling edge when the input comprises a rising or falling edge and the input signal is determined to be less than the set voltage reference; and wherein the voltage reference output signal is provided as the input signal to the passive differentiator circuit.

It will be further understood that the method may be limited to specific implementations of the devices, systems and apparatus described herein, such as only detecting rising or falling edges of an input signal.

BRIEF DESCRIPTION OF THE EMBODIMENTS

Some embodiments of the disclosure will now be described by way of example only and with reference to the accompanying drawings, in which:

FIGS. 1A and B depict a circuit diagram of an example digital rising edge detection circuit (FIG. 1A) and example signal waveforms (FIG. 1B).

FIGS. 2A and B depict a circuit diagram of an example digital falling edge detection circuit (FIG. 2A) and example signal waveforms (FIG. 2B).

FIGS. 3A and B depict a circuit diagram of an example edge detection circuit comprising an operational amplifier (FIG. 3A) and example input and output signals (FIG. 3B)

Figure 6A:
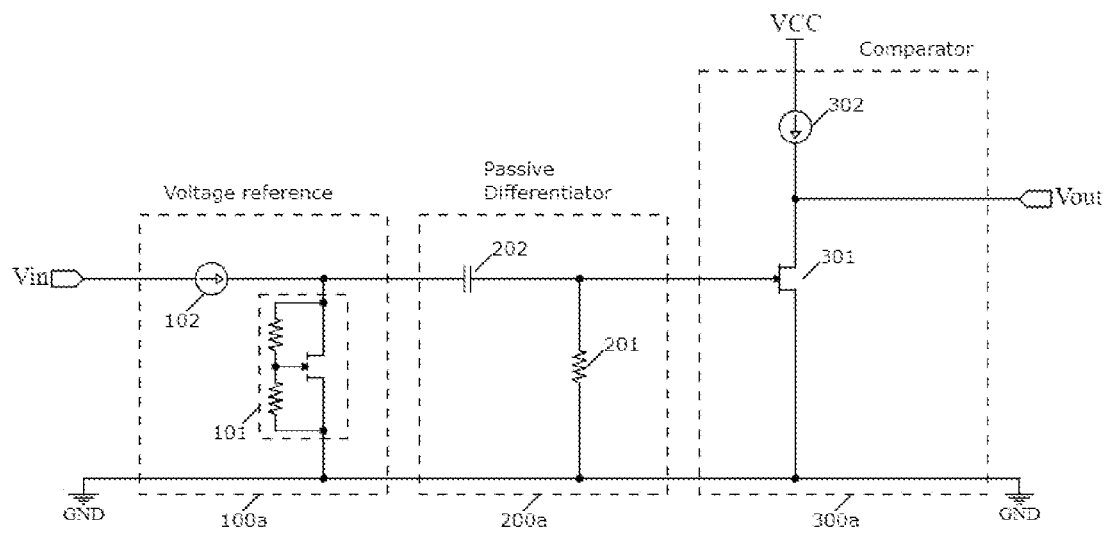
Figure 6B:
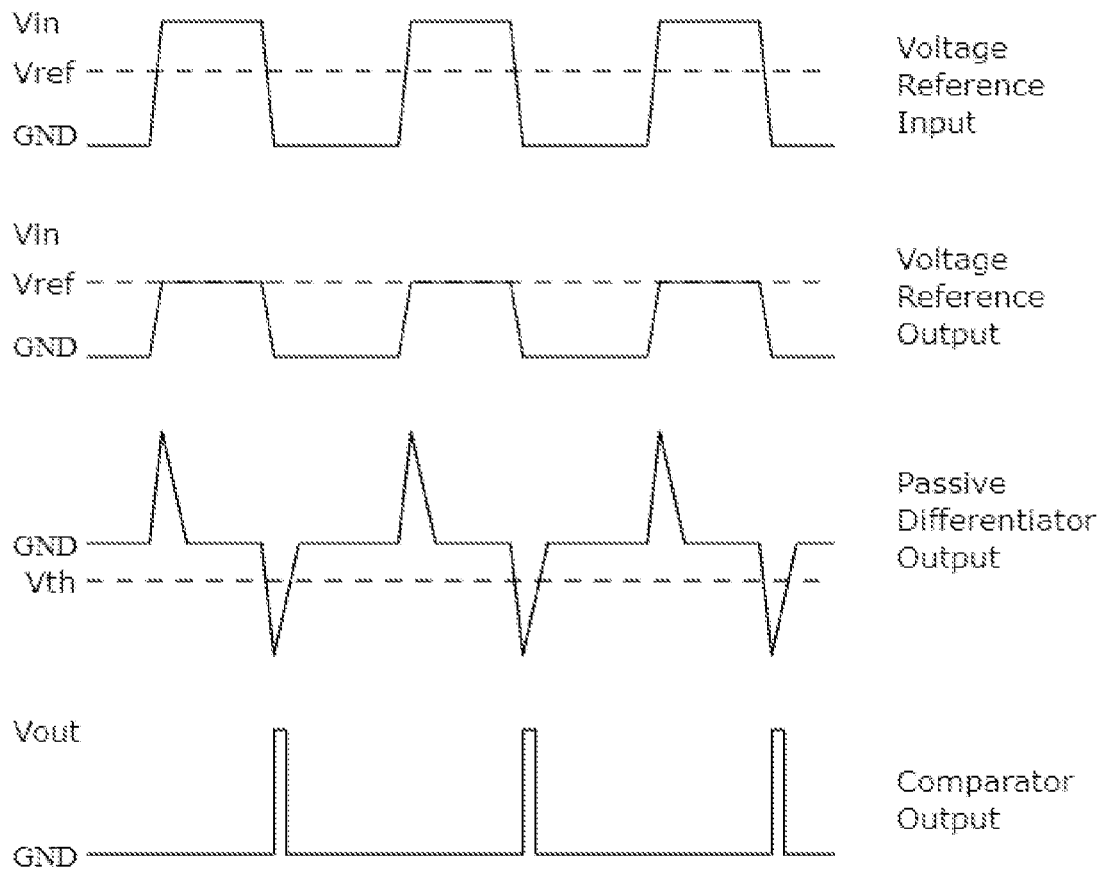

FIGS. 6A, B and C depict a circuit diagram of an example falling edge detection circuit according to an implementation of the present disclosure (FIG. 6A) and example input and output signals (FIGS. 6B and C).

Figure 7A:
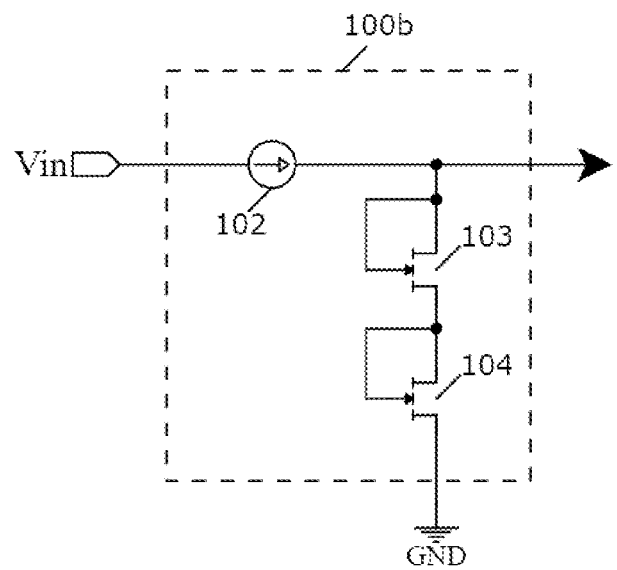

FIGS. 7A and B depict circuit diagrams of example voltage reference circuits according to implementations of the present disclosure.

Figure 8:
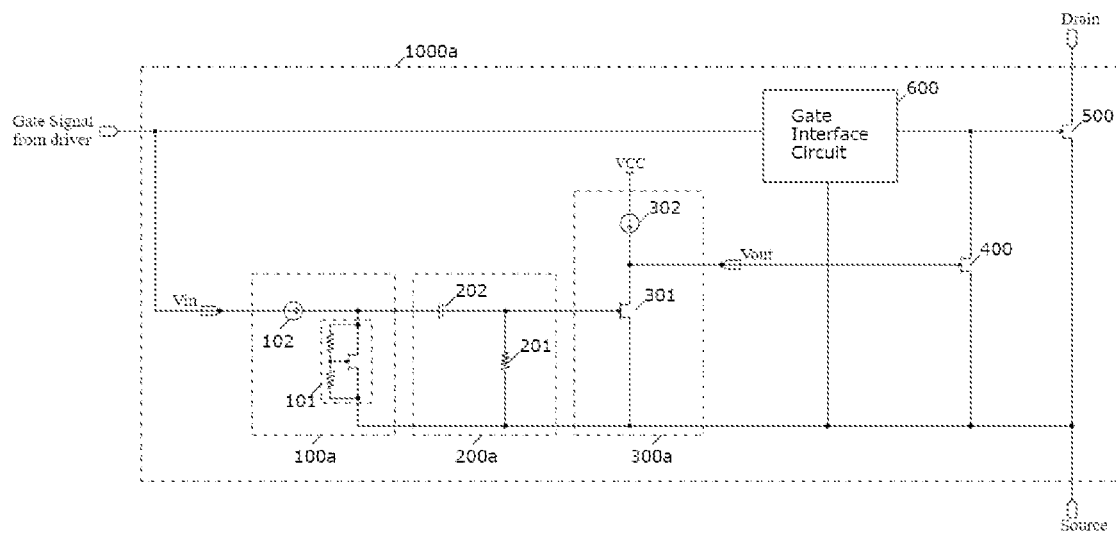

FIG. 8 depicts a circuit diagram of an edge detection circuit according to an implementation of the present disclosure configured for use in an integrated circuit to operate a Miller clamp.

Figure 9:
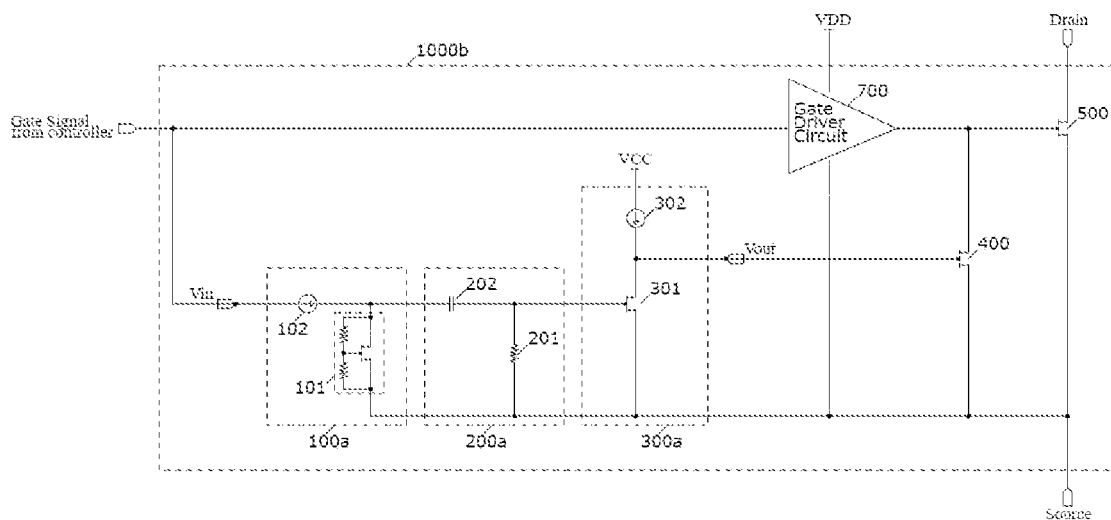

FIG. 9 depicts a circuit diagram of an edge detection circuit according to an implementation of the present disclosure configured for use in an integrated circuit to operate a Miller clamp.

Figure 10A:
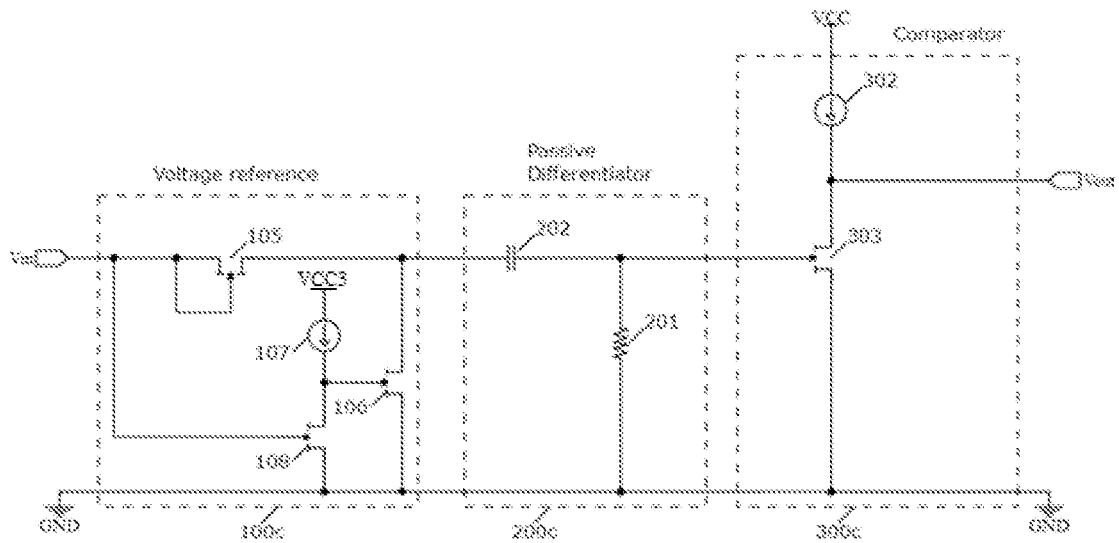
Figure 10B:
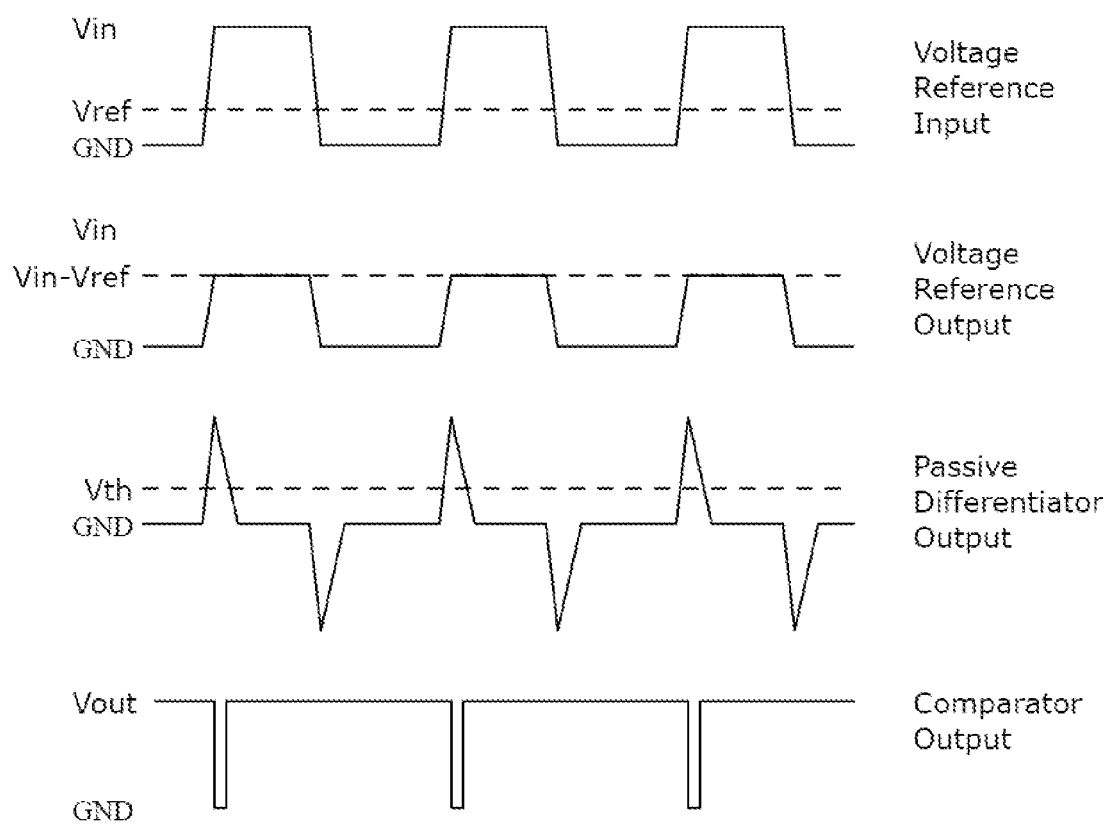
Figure 10C:
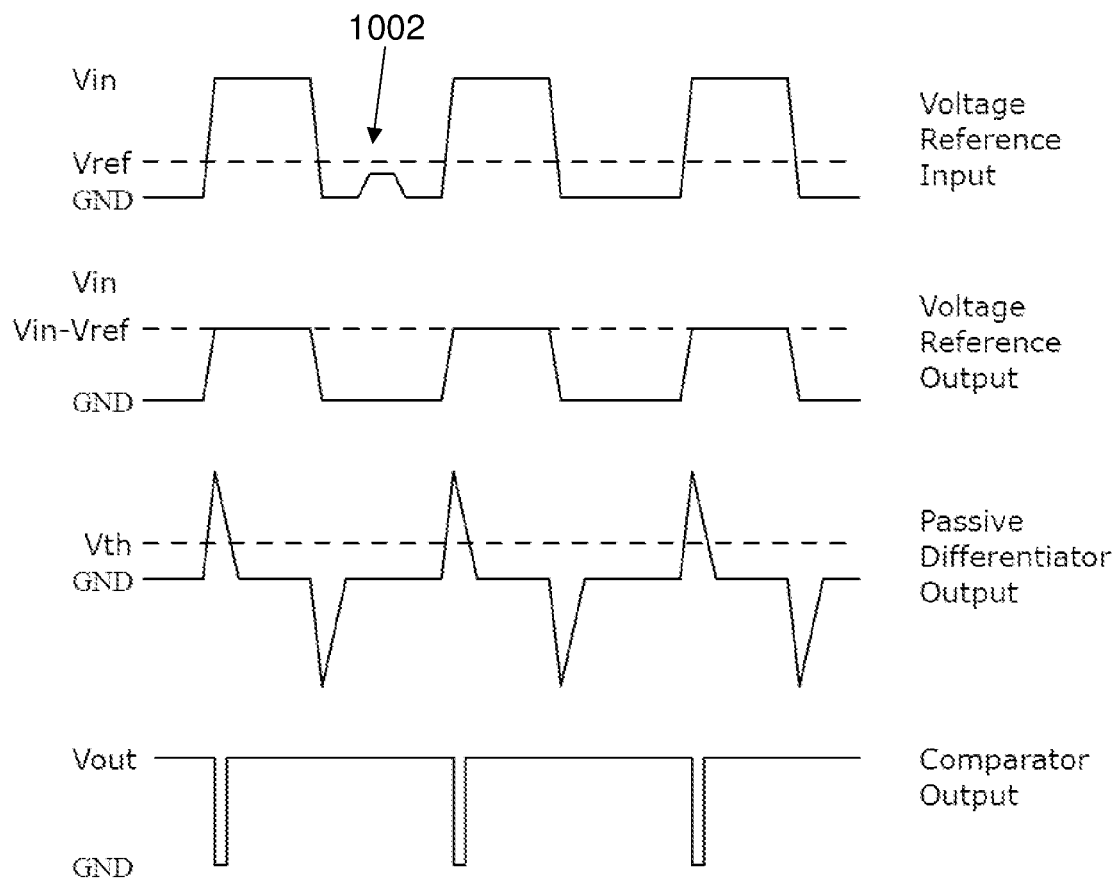

FIGS. 10A, B and C depict a circuit diagram of an example rising edge detection circuit according to an implementation of the present disclosure (FIG. 10A) and example input and output signals (FIGS. 10B and C).

Figure 11:
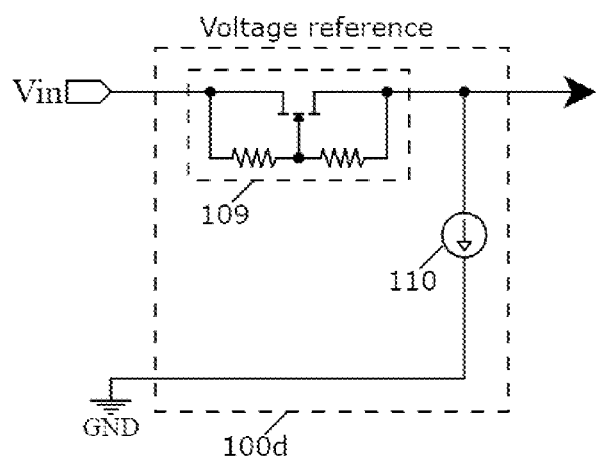

FIG. 11 depicts a circuit diagram of a further example voltage reference circuit according to an implementation of the present disclosure.

Figure 12A:
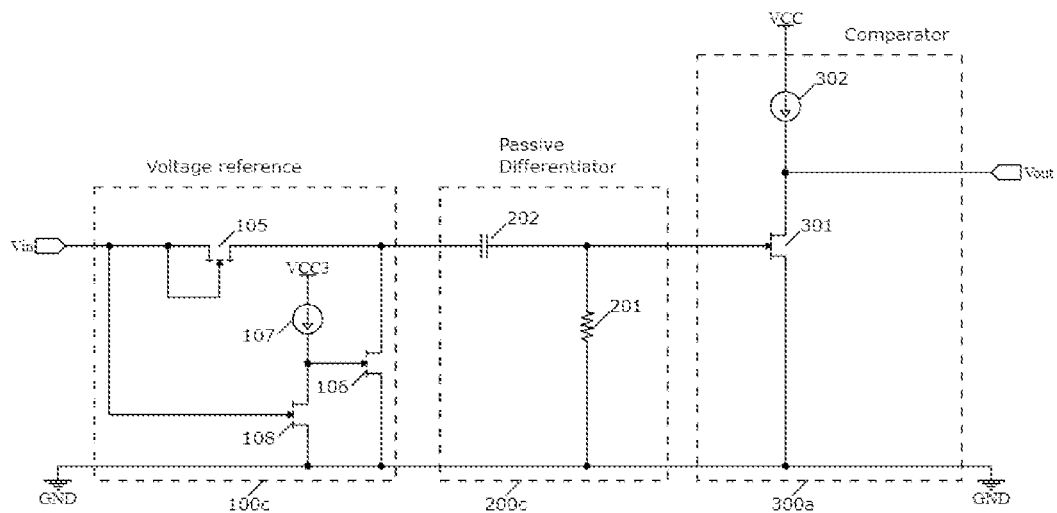
Figure 12B:
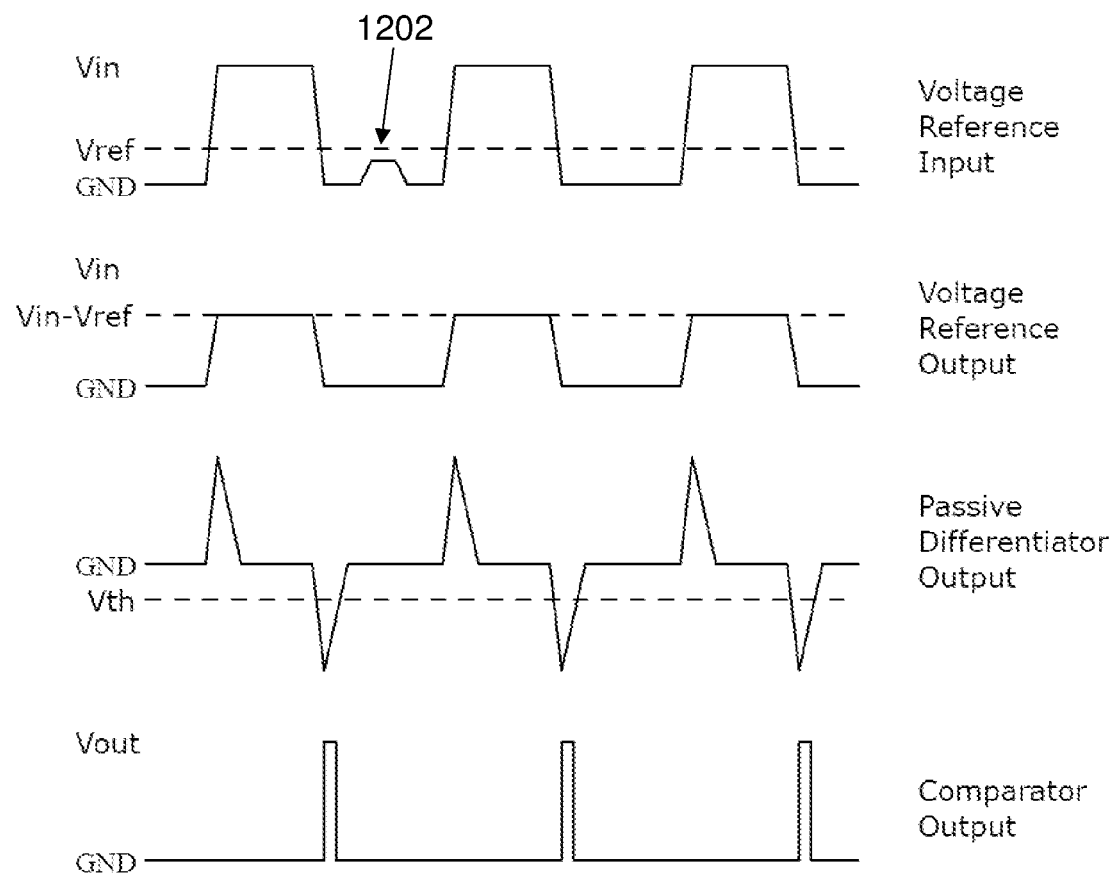

FIGS. 12A and B depict a circuit diagram of a further example falling edge detection circuit according to an implementation of the present disclosure (FIG. 12A) and example input and output signals (FIG. 12B).

Figure 13A:
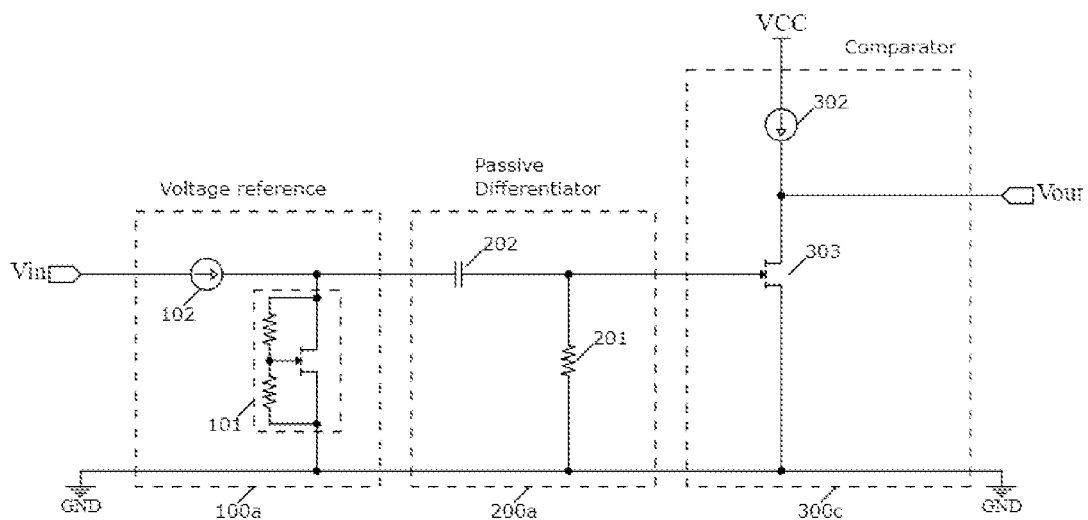
Figure 13B:
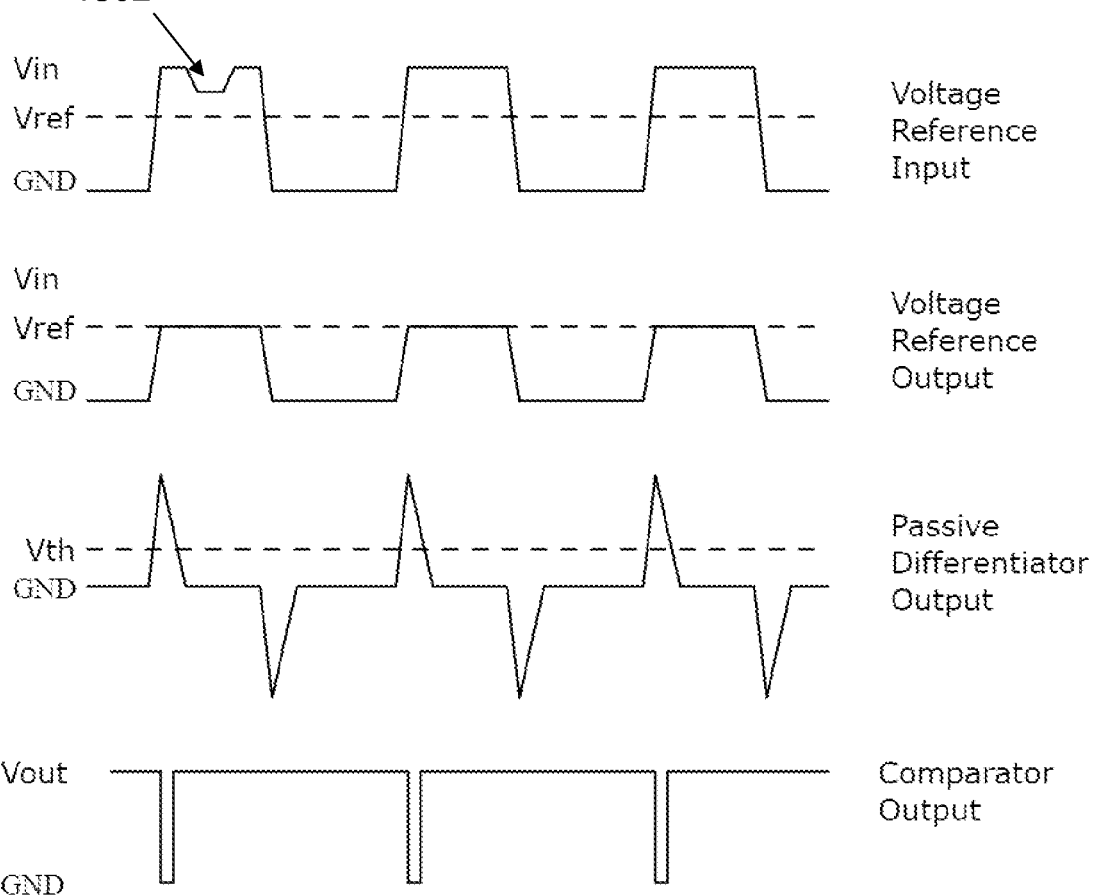

FIGS. 13A and B depict a circuit diagram of a further example rising edge detection circuit according to an implementation of the present disclosure (FIG. 13A) and example input and output signals (FIG. 13B).

Figure 14:
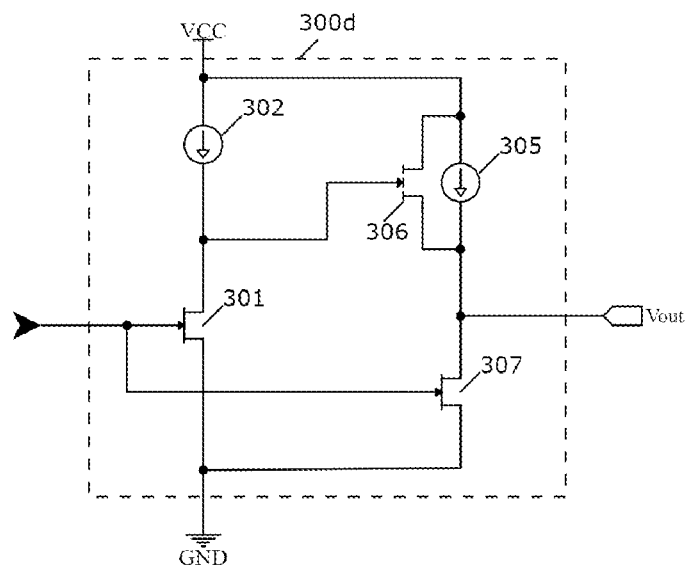

FIG. 14 depicts a circuit diagram of an example comparator circuit according to an implementation of the present disclosure.

Figure 15:
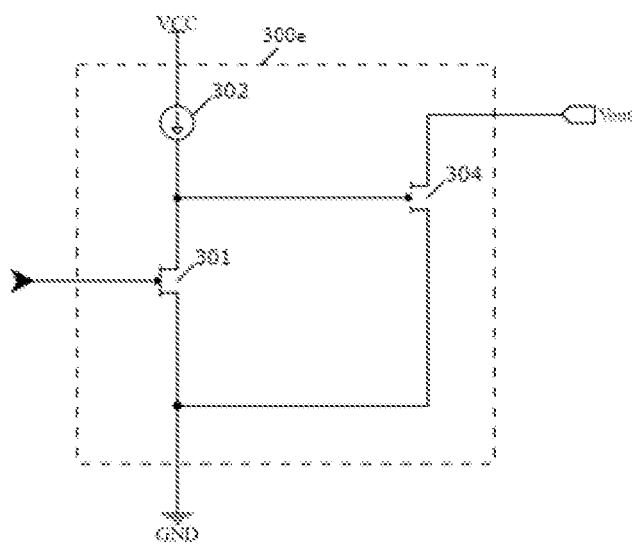

FIG. 15 depicts a circuit diagram of a further example comparator circuit according to an implementation of the present disclosure.

Figure 16A:
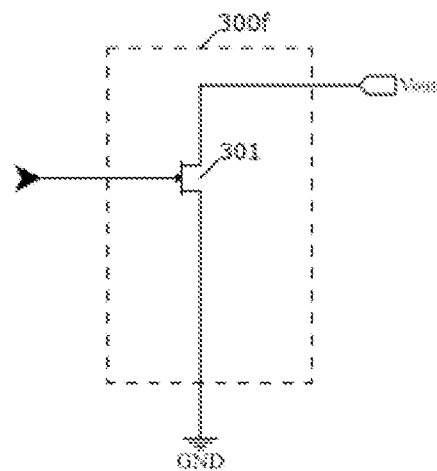
Figure 16B:
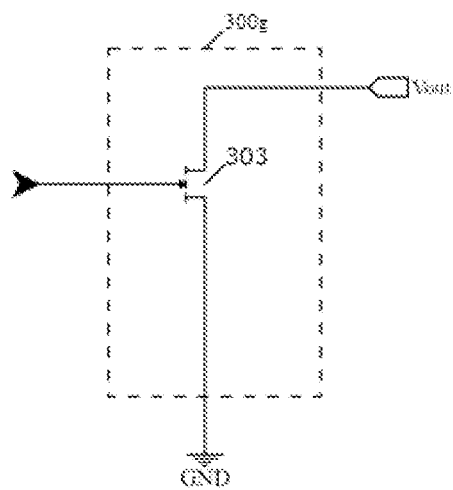

FIGS. 16A and B depict circuit diagrams of example differentiator circuits according to implementations of the present disclosure.

Figure 17A:
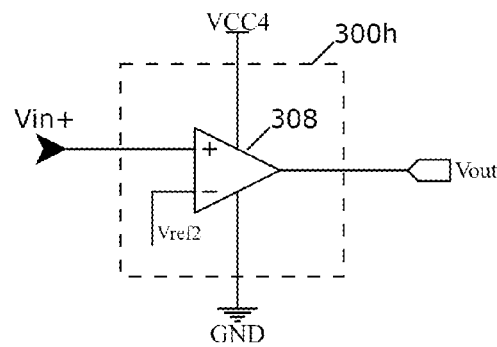

FIGS. 17A and B depict circuit diagrams of example comparator circuits comprising a reference voltage according to implementations of the present disclosure. FIG. 17C illustrates example input and output signals for the comparator circuits depicted in FIGS. 17A and B.

DETAILED DESCRIPTION OF THE EMBODIMENTS

Aspects of the invention will now be described by reference to example embodiments. It will be understood that the implementations depicted and described herein are provided as illustrative examples, and are not intended to limit the scope of the present invention to only the depicted embodiments. For example, it will be appreciated that the depicted example voltage reference, differentiator and/or comparator circuits may be combined in any combination to provide edge detection circuits suitable for a desired purpose.

It will be understood that while the below examples are generally depicted comprising a square wave or step input signal and Dirac output signal, the input signal may instead be any signal comprising rising and/or falling edges, and the output of the edge detection circuit will provide an output signal that corresponds to the time differential (i.e. the rate of change) of the input signal.

Figure 1A:
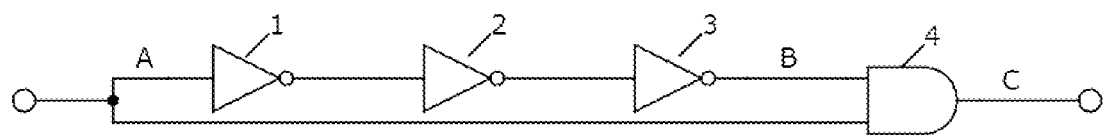
Figure 1B:
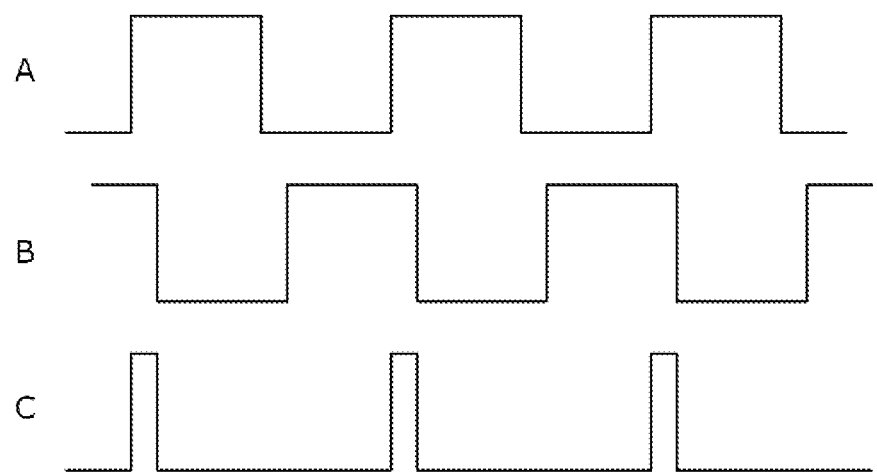

FIG. 1A shows an example digital rising edge detection circuit. The circuit comprises three inverters 1, 2, 3 and an AND logic gate 4. FIG. 1B shows example signal waveforms corresponding to signals at points A, B and C of the edge detection circuit. Example input signal A is delayed and inverted by the three inverters 1, 2, 3 to produce a comparison signal B. The AND gate 4 receives signals A and B as its inputs and produces output signal C. In operation, the AND logic gate 4 outputs a signal when both square wave signals A and B are equal to 1 and otherwise provides no output. Thus, output signal C comprises a pulse signal when a rising edge of the input signal A is detected. It will be understood that a duration of the output pulse may be determined by the delay introduced by the three inverters 1, 2, 3.

Figure 2A:
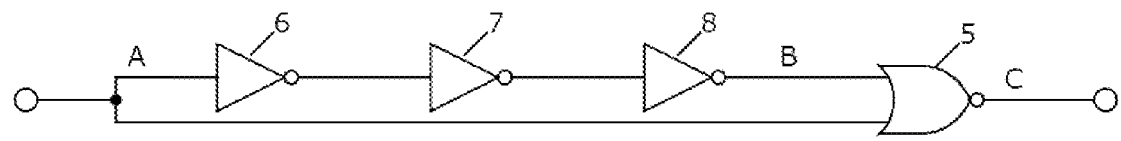
Figure 2B:
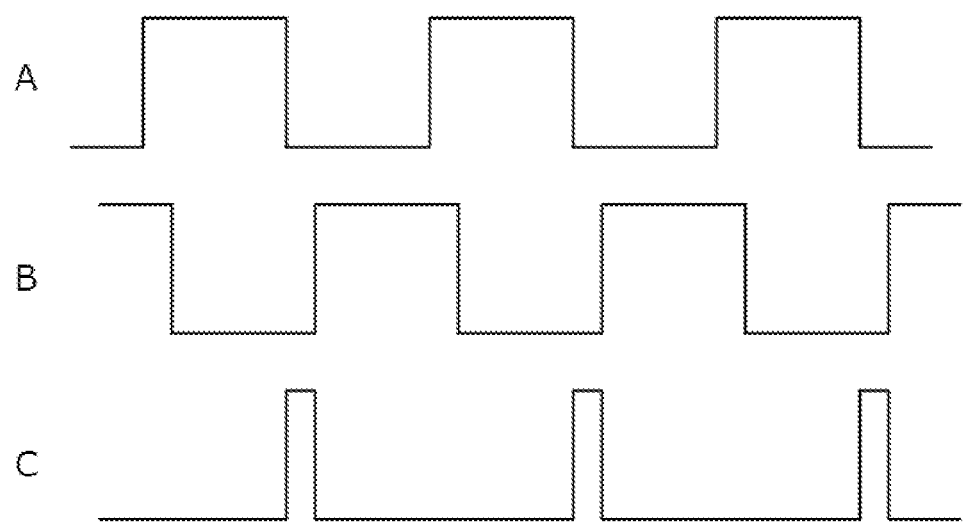

FIG. 2A shows an example digital falling edge detection circuit. The circuit comprises three inverters 6, 7, 8 and a NOR logic gate 5. FIG. 2B shows example signal waveforms corresponding to signals at points A, B and C of the edge detection circuit. Example input signal A is delayed and inverted by the three inverters 6, 7, 8 to produce a comparison signal B. The NOR gate 5 receives signals A and B as its inputs and produces output signal C. In operation, the NOR logic gate 5 outputs a signal when both square wave signals A and B are equal to 0 and otherwise provides no output. Thus, output signal C comprises a pulse signal when a falling edge of the input signal A is detected. It will be understood that a duration of the output pulse may be determined by the delay introduced by the three inverters 5, 6, 7.

Figure 3A:
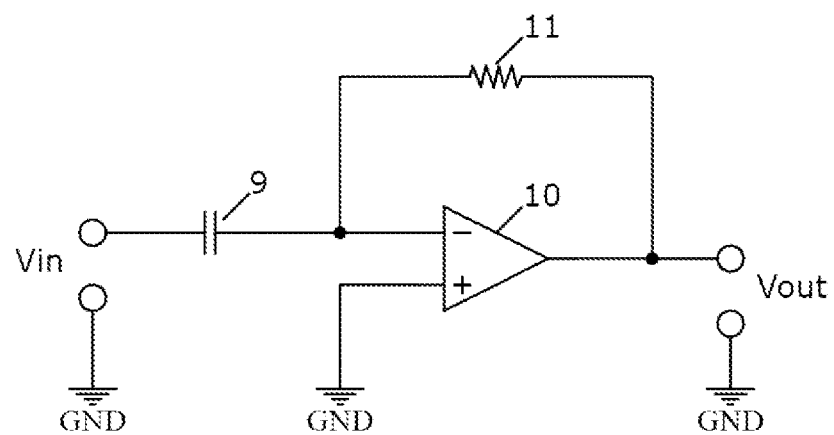
Figure 3B:
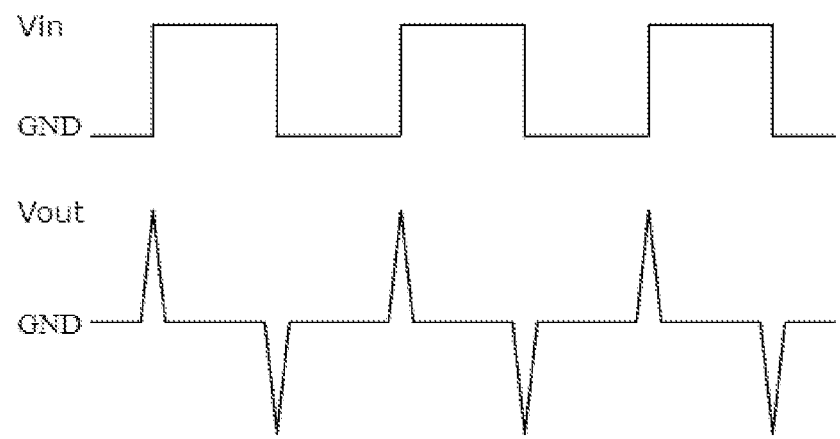

FIG. 3A shows an example analogue edge detection circuit comprising an operational amplifier 10, a resistor 11 and a capacitor 9. The circuit may be referred to as an ideal differentiator circuit. The input ($V_{in}$) and output ($V_{out}$) signals of the edge detection circuit are illustrated in FIG. 3B. The output signal is proportional to the rate of change (i.e. the time derivative) of the input signal. Thus, as shown in FIG. 3B, the output signal comprises a spike signal when a rising or falling edge is detected in the input signal. A positive spike occurs in the output signal when a rising (or positive) edge is detected in the input signal, while a negative spike occurs in the output signal when a falling (or negative) edge is detected in the input signal.

Figure 4:
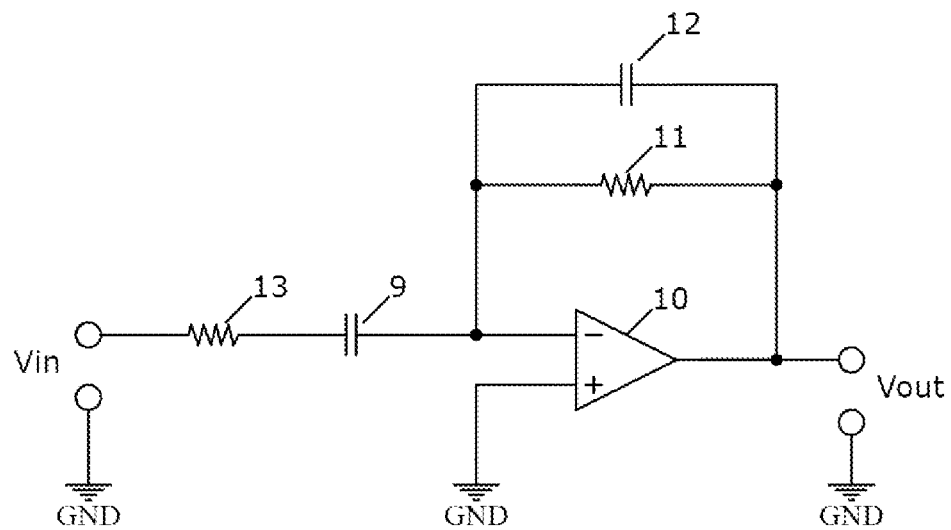
FIG. 4 depicts a circuit diagram of an example edge detection circuit comprising an operational amplifier and providing reduced noise detection.

FIG. 4 shows an example analogue edge detection circuit that provides resistance to false triggering events such as input signal noise. In addition to the components depicted in FIG. 3A, this circuit comprises an additional feedback capacitor 12 and input resistor 13. The gain of this circuit increases with an increasing input signal frequency. For example, at a particular frequency, $f_1$, the gain becomes unity (0 dB), and may increase at a rate of e.g. 20 dB per decade till the input frequency reaches a second frequency, $f_2$. At input signal frequencies above $f_2$, the gain of the circuit may decrease at a rate of e.g. 20 dB per decade due to the addition of the resistor 13 and capacitor 12. Thus, the circuit may be appropriately configured to detect the input rising and falling edges as in FIG. 3B, while rejecting high frequency input (e.g. noise) signals.

Figure 5:
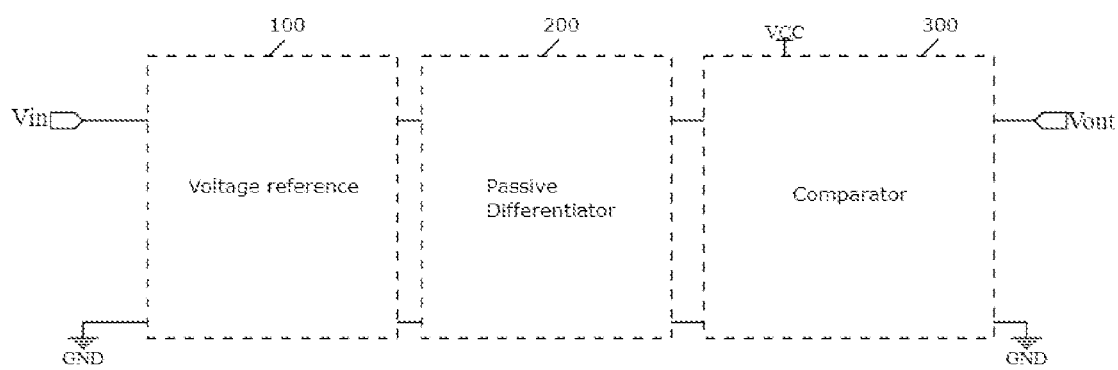
FIG. 5 depicts a block schematic diagram of an edge detection circuit according to an implementation of the present disclosure.

FIG. 5 depicts a block schematic of an example edge detection circuit. The edge detection circuit comprises an optional voltage reference set circuit 100, a passive differentiator circuit 200 and a comparator circuit 300 connected to a power supply voltage $V_{cc}$.

Generally speaking, an input signal may be provided to the passive differentiator circuit 200, which is configured to detect a change in the input signal. The passive differentiator circuit 200 provides an output signal comprising pulses or spike signals corresponding to rising and falling edges of the input signal. The output signal of the passive differentiator circuit 200 may comprise positive pulses or spikes corresponding to rising edges of the input signal and negative pulses or spikes corresponding to falling edges of the input signal. The comparator circuit 300 may receive the signal from the passive differentiator circuit 200 and compare the pulses or spikes to a threshold voltage. The threshold voltage may refer to the threshold voltage of a transistor used in some implementations of the comparator circuit. Threshold voltage may alternatively refer to an applied reference voltage in other implementations. The reference voltage may be generated on-chip or applied externally. The comparator circuit 300 may then provide an output with pulses or spikes corresponding only to pulses or spikes crossing the threshold voltage. Thus, by providing a positive reference signal the comparator may provide an output that selects the rising edges of the initial input signal. Similarly, by providing a negative reference signal the comparator may provide an output that selects the falling edges of the initial input signal. The passive differentiator circuit 200 and comparator circuit 300 are therefore generally configured to perform the functions of detecting rising/falling edges of an input signal and selecting the rising or falling edge respectively.

The optional voltage reference circuit 100 may be configured to receive the initial input signal and detect whether a change in the input signal is above or below a reference voltage. Thus, the voltage reference circuit 100 may reduce or remove small amplitude noise from the input signal prior to passing it to the passive differentiator circuit 200. While the below embodiments each comprise a voltage reference circuit 100, it will be understood that voltage reference circuit 100 is an optional component of the edge detection circuit in implementations, and may be excluded in e.g. edge detection circuits that are not intended or configured for use in high noise or high sensitivity operations.

Various implementations of suitable voltage reference, a passive differentiator and comparator circuits will now be described. It will be further understood that the following example voltage reference, a passive differentiator and comparator circuits are provided as illustrative examples only, and are not intended to limit the scope of the invention solely to the specific implementations depicted herein.

FIG. 6A depicts an example of a falling edge detection circuit comprising a voltage reference circuit 100a, a passive differentiator circuit 200a and a comparator circuit 300a. The edge detection circuit receives a signal $V_{in}$ as an input to the voltage reference circuit 100a. The voltage reference circuit 100a comprises a threshold multiplier 101 and a current source 102. As shown in FIG. 6B, the voltage reference circuit 100a may limit the magnitude of the voltage reference circuit input signal to a voltage reference $V_{ref}$. $V_{ref}$ is therefore equal to a maximum value of the output of voltage reference circuit 100a. The value of $V_{ref}$ may be controlled through the configuration of the threshold multiplier 101, for example by controlling the ratio of the two resistors connected to the gate of the enhancement mode transistor. In addition, as no additional voltage source is required in voltage reference circuit 100a, the voltage reference circuit 100a may be integrated into many edge detection circuits with minimal changes to the overall circuit design.

Figure 6C:
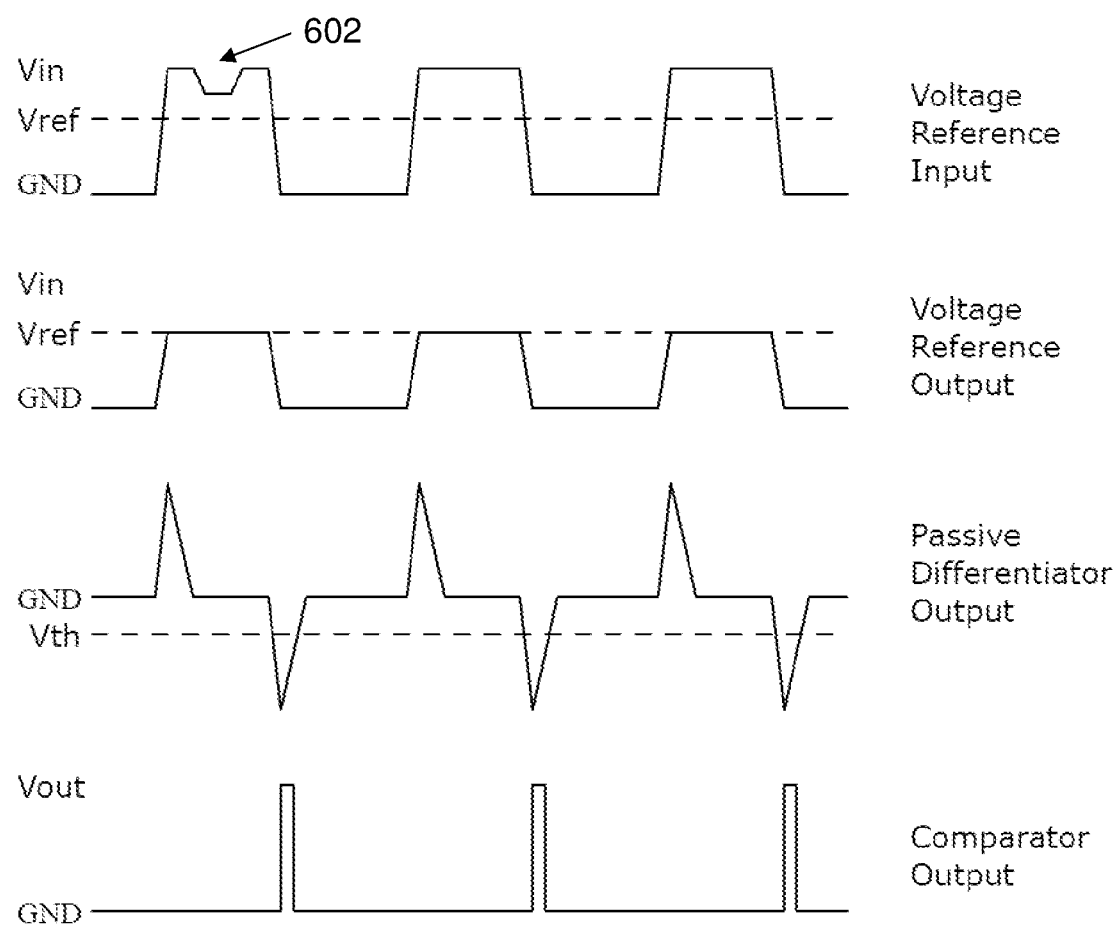

As briefly stated above, the voltage reference circuit 100a is configured such that the reference voltage $V_{ref}$ is a maximum value of the voltage reference circuit output. As a result, any input signal $V_{in}$ with an amplitude greater than the reference voltage $V_{ref}$ will result in an output signal from voltage reference circuit 100a with an amplitude equal to the reference voltage $V_{ref}$. As a result of this configuration, the use of the voltage reference circuit 100a in the edge detection circuit prior to the passive differentiator circuit 200a may provide a degree of noise immunity and/or protection against false triggering events. This is because any falling edge does not appear at the output of the voltage reference circuit unless the input voltage $V_{in}$ drops below the reference voltage $V_{ref}$. Therefore, as shown in FIG. 6C, a low amplitude noise signal or a low amplitude dip in the $V_{in}$ maximum signal such as dip 602 is removed from the voltage reference output signal, and thus the falling edge of dip 602 will not be detected by the edge detection circuit. Similarly, a rising edge also will not appear at the output of the voltage reference circuit 100a unless the rising edge input signal occurs when the magnitude of the input voltage $V_{in}$ is smaller than the voltage reference $V_{ref}$.

Thus, only rising or falling edges of the input signal $V_{in}$ that occur when the amplitude of the input signal $V_{in}$ is below the reference voltage $V_{ref}$ will be maintained in the output of the voltage reference circuit 100a. Voltage reference circuit 100a may therefore be referred to as a low-pass voltage reference circuit.

Other implementations of low-pass voltage reference circuits are depicted in FIGS. 7A and B. In the voltage reference circuit 100b of FIG. 7A, threshold multiplier 101 is replaced by two source-gate connected enhancement mode transistors 103, 104 connected in series. The enhancement mode source-gate connected transistor may be e.g. a HEMT, which display diode-like characteristics with a positive threshold voltage. In the implementation shown in voltage reference circuit 100b, the maximum voltage reference output is double the threshold voltage of the source-gate connected transistor. However, it will be understood that the voltage reference circuit 100b may be configured with different numbers of series connected source-gate connected transistors to provide a desired maximum voltage reference output value.

Figure 7B:
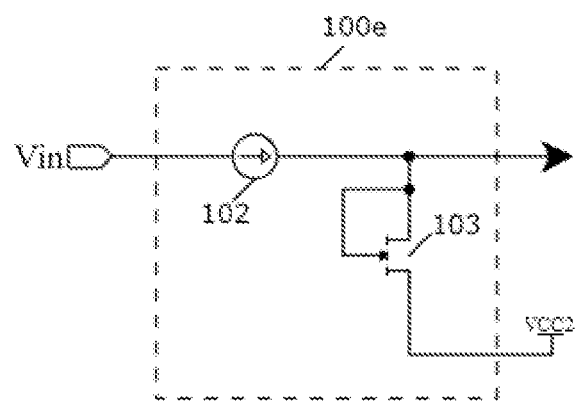

Meanwhile, in voltage reference circuit 100e of FIG. 7B, the source-gate connected enhancement mode transistor 103 is electrically connected to fixed voltage supply $V_{cc2}$. The voltage supply $V_{cc2}$ may any suitable source, and may e.g. be applied externally or generated on a chip. Advantageously, the configuration of voltage reference circuit 100e enables the reference voltage $V_{ref}$ to be controlled by adjusting the voltage supply $V_{cc2}$.

Returning to FIG. 6A, the output of the voltage reference circuit 100a is provided as an input to the passive differentiator circuit 200a. In implementations receiving a square wave input signal $V_{in}$, the output of the voltage reference circuit 100a is also a square signal.

The passive differentiator circuit 200a comprises a resistor 201 and a capacitor 202. In implementations, resistor 201 may be replaced or combined with a current source. The passive differentiator circuit 200a detects rising and falling edges of the voltage reference output signal, and provides an output that is (approximately) proportional to the rate of change (i.e. the time derivative) of the voltage reference output signal, as shown in FIG. 6B. The duration and size of the output spikes or pulses of the passive differentiator output may be controlled via the configuration of the passive differentiator circuit 200a, for example by adjusting the capacitance and resistance of capacitor 202 and resistor 201 respectively. As can be seen from a comparison of FIGS. 6B and C, the passive differentiator output is unaffected by low amplitude noise (such as dip 602) in the input signal $V_{in}$ due to the presence of the voltage reference circuit 100a.

The passive differentiator circuit 200a receives an input signal from the voltage reference circuit 100a and supplies an output signal (the passive differentiator output) to the comparator circuit 300a. Comparator circuit 300a comprises a pull-up component such as current source 302 and a depletion mode transistor 301. It will be understood that other implementations of the comparator circuit may comprise different pull-up components to provide a desired output signal voltage. The current source 302 and a depletion mode transistor 301 form an inverter circuit, and thus in this implementation comparator circuit 300a may be referred to as an inverter or an inverter circuit. The comparator circuit 300a is powered by supply voltage $V_{cc}$, and the peak voltage of the output signal $V_{out}$ from comparator circuit 300a is equal to the supply voltage $V_{cc}$. However, it will be understood that the peak voltage of the output voltage signal $V_{out}$ is dependent on the configuration of the comparator circuit 300a, and may vary depending on e.g. the pull-up component of the inverter.

In comparator circuit 300a, the depletion mode transistor 301 turns-off when the gate-source voltage drops below its negative threshold voltage $V_{th}$. The negative threshold voltage $V_{th}$ is illustrated in FIG. 6B. When the passive differentiator output (which acts as an input for the comparator circuit 300a) has a negative spike below the threshold voltage $V_{th}$ the depletion mode transistor turns-off, leading to a positive output of the inverter.

Thus, as shown in FIG. 6B, each falling edge in the input signal $V_{in}$ results in a positive output pulse or spike at the output signal $V_{out}$. This means that the negative threshold comparator circuit 300a selects a falling edge from the input signal, such that edge detection circuits comprising the negative threshold comparator circuit 300a are falling edge detection circuits.

For the sake of clarity, it is again noted that a falling edge in the input signal $V_{in}$ is only selected in the output signal $V_{out}$ if the input signal $V_{in}$ drops below the voltage reference $V_{ref}$, due to the presence of the voltage reference circuit 100a. This can be seen via a comparison between the comparator output signals shown in FIGS. 6B and 6C (i.e. the falling edge of dip 602 does not result in a corresponding pulse in the output signal). However, as described above, in implementations without a voltage reference circuit, by suitably selecting the threshold voltage small amplitude dips such as dip 602 may still be removed from the output signal, as the amplitude of the corresponding differentiator output signal spike may have an insufficient amplitude to turn-off the transistor.

FIGS. 8 and 9 illustrate examples of implementations of the falling edge detection circuit of FIG. 6A used in an integrated circuit to operate a Miller clamp 400 connected between the gate and source terminal of an enhancement mode power transistor 500. The enhancement mode power transistor 500 may be e.g. a GaN HEMT with a pGaN gate. The power transistor 500, Miller clamp 400 and edge detection circuit 100a, 200a, 300a may be monolithically integrated to form a GaN integrated circuit 1000a. Additionally, as illustrated in FIG. 8, the GaN integrated circuit may further comprise any suitable gate interface circuit 600, such as gate interface circuit(s) as described in e.g. US Patent App. Publication No. US2021/0335781 (A1) and/or PCT Patent App. Publication No. WO 2020/225362 A1, the contents of which are incorporated herein by reference in their entirety. As illustrated in FIGS. 6B and C, when the gate (i.e. $V_{in}$) signal from the driver contains a falling edge which falls below a set voltage reference (i.e. $V_{ref}$), the edge detection circuit will output a positive voltage spike. In this example, if the output voltage spike or pulse of the edge detection circuit has a magnitude greater than the threshold voltage of the Miller clamp transistor 400, the edge detection circuit will turn-on the Miller clamp transistor 400. Thus, the detection of a falling edge in the gate signal from the driver by the edge detection circuit can increase the speed of the turn-off operation of the power transistor 500. In FIG. 9, rather than a gate interface circuit 600, a gate driver circuit 700 may be monolithically integrated with the power transistor 500, Miller clamp 400 and edge detection circuit 100a, 200a, 300a to form a GaN integrated circuit 1000b. The integrated circuit 1000b of FIG. 9 otherwise operates identically to the integrated circuit 1000a of FIG. 8.

It will be understood that any implementations of the edge detection circuits described herein may be used to operate a Miller clamp, as described above.

In further implementations, the integrated circuits 1000a, b may instead be configured such that the output $V_{out}$ of the edge detection circuits acts on an internal logic signal to operate the Miller clamp, rather than directly on the gate of the Miller Clamp transistor 400.

FIG. 10A depicts an example of a rising edge detection circuit. The rising edge detection circuit comprises a voltage reference circuit 100c, a passive differentiator circuit 200c and a comparator circuit 300c. Similarly to the edge detection circuit of FIG. 6A, the passive differentiator circuit 200c receives an input signal from the voltage reference circuit 100c and supplies an output signal to the comparator circuit 300c. The output signal of the passive differentiator circuit 200c is (approximately) proportional to the rate of change (i.e. the time derivative) of the voltage reference output signal. The passive differentiator circuit 200c is identical to the passive differentiator circuit 200a of FIG. 6A, and discussions relating to the passive differentiator circuit 200a above apply equally to the passive differentiator circuit 200c. In contrast, comparator circuit 300c differs from comparator circuit 300a in that it comprises an enhancement mode transistor 303 in place of the depletion mode transistor 301 of comparator circuit 300a. The enhancement mode transistor 303 turns-on when the gate-source voltage rises above its positive threshold voltage $V_{th}$, as illustrated in FIG. 10B. Thus, when the passive differentiator output (which acts as an input signal for the comparator circuit 300c has a positive spike above the threshold voltage $V_{th}$ the enhancement mode transistor 303 can turn-on, resulting in a high-to-low spike in the output signal $V_{out}$ of the edge detection circuit. Therefore, as shown in FIG. 10B, a rising edge in the input signal $V_{in}$ results in a low output at the output signal $V_{out}$. This means that, in general, the positive threshold comparator circuit 300c selects a rising edge from the input signal, such that edge detection circuits comprising the positive threshold comparator circuit 300c are rising edge detection circuits. It is noted that the comparator circuit 300c is otherwise identical to the comparator circuit 300a, and discussions above relating to the comparator circuit 300a apply equally to comparator circuit 300c. In this example, the transition in the output signal $V_{out}$ of the edge detection circuit is from a high output to a low output when a rising signal is detected. An additional inverter stage may be connected to the output to obtain an output signal that switches from low output to high output when a rising signal is detected.

The voltage reference circuit 100c comprises an enhancement mode transistor 105 connected in series between the input and output of the voltage reference circuit 100c. The voltage reference circuit 100c further comprises an enhancement mode transistor 108 and current source 107 forming an inverter circuit, and an enhancement mode transistor 106. The input and output of the voltage reference circuit are illustrated in FIG. 10B. In contrast to the voltage reference circuit 100a, the voltage reference circuit 100c provides an output signal only when the input signal $V_{in}$ is greater than a voltage reference $V_{ref}$. Thus, a peak or maximum voltage reference output is equal to the difference between the input signal $V_{in}$ and the voltage reference $V_{ref}$. The voltage reference $V_{ref}$ may be controlled in voltage reference circuit 100c by the threshold voltage of the enhancement mode transistor 105. In other implementations, the circuit 100c may comprise multiple enhancement mode transistors 105 to provide a desired voltage reference value. For example, the voltage reference may be set at twice the threshold voltage of the enhancement mode transistors an implementation comprising two such transistors in series.

As briefly stated above, the voltage reference circuit 100a is configured such that only input signals $V_{in}$ with an amplitude greater than the reference voltage $V_{ref}$ will result in an output signal from voltage reference circuit 100c. As a result of this configuration, the use of the voltage reference circuit 100c in the edge detection circuit prior to the passive differentiator circuit 200c may provide a degree of noise immunity and/or protection against false triggering events. This is because any rising edge does not appear at the output of the voltage reference circuit unless the input voltage $V_{in}$ rises above the reference voltage $V_{ref}$. Therefore, as shown in FIG. 100, a low amplitude noise signal or a low amplitude rise in the $V_{in}$ minimum signal such as rise 1002 is removed from the voltage reference output signal, and thus the rising edge of rise 1002 will not be detected by the edge detection circuit. Similarly, a falling edge also will not appear at the output of the voltage reference circuit 100c unless the falling edge input signal occurs when the magnitude of the input voltage $V_{in}$ is greater than the voltage reference $V_{ref}$.

Thus, only rising or falling edges of the input signal $V_{in}$ that occur when the amplitude of the input signal $V_{in}$ is above the reference voltage $V_{ref}$ will be maintained in the output of the voltage reference circuit 100c. Voltage reference circuit 100c may therefore be referred to as a high-pass voltage reference circuit.

A further example of a high-pass voltage reference circuit is shown in FIG. 11. Voltage reference circuit 100d of FIG. 11 comprises a threshold multiplier 109 connected in series between the input and output of the voltage reference circuit 100d, and further comprises a current source 110 connected between the output of the voltage reference circuit and a ground reference. The voltage reference $V_{ref}$ may be controlled via the configuration of the voltage reference circuit 100d, for example by adjusting the ratio of the two resistors in the threshold multiplier circuit 109.

As briefly described above, the various voltage reference circuits, passive differentiator circuits and comparator circuits described in this disclosure may be combined as desired to produce a suitable edge detection circuit. For example, FIG. 12A depicts an edge detection circuit comprising the comparator circuit 300a of FIG. 6A and the voltage reference circuit 100c of FIG. 10A to form a falling edge detection circuit which does not detect a falling edge unless the input signal is above a voltage reference $V_{ref}$. For example, a falling edge of the small amplitude rise or noise 1202 is not detected in the output of the edge detection circuit, as shown in FIG. 12B. In implementations, the voltage reference circuit 100c may be replaced by other high-pass voltage reference circuits, such as voltage reference circuit 100d. It will be further understood that a rising edge detection circuit may equally be formed which does not detect a rising edge unless the input signal is below a voltage reference $V_{ref}$ by e.g. combining the comparator circuit 300c with a low-pass voltage reference circuit such as voltage reference circuits 100a, b or e. One such example rising edge detection circuit comprising comparator circuit 300c and voltage reference circuit 100a is shown in FIG. 13A. A rising edge of the small amplitude dip or noise 1302 is not detected in the output of the edge detection circuit, as shown in FIG. 13B.

Implementations of the falling and rising edge detection circuits may comprise multiple voltage reference circuits. For example, an edge detection circuit may comprise a high-pass voltage reference circuit with a reference voltage $V_{high}$ connected in series with a low-pass voltage reference circuit with a reference voltage $V_{low}$. By configuring the two voltage reference circuits such that $V_{high}$ is less than $V_{low}$, an output signal of the combined voltage reference circuits may reduce or remove noise from both the peaks and troughs of the input signal $V_{in}$, to thereby provide a greater degree of noise immunity and/or protection against false triggering events than provided by a single high or low-pass voltage reference circuit.

Additionally or alternatively, further components may be included in the edge detection circuit. For example, a voltage divider may be provided between the passive differentiator circuit 200 and the comparator circuit 300 to increase and/or adjust the voltage threshold of the comparator circuit 300. Such a voltage divider may be provided between the input signal of the comparator circuit 300 and the ground or voltage source $V_{cc}$. In another example, filtering components, including resistors, capacitors and diodes, may also be provided in any of the implementations described above. The inclusion of diodes may, for example, assist in clamping and protecting the gate(s) of the comparator circuit.

In a further implementation a falling edge detection circuit may comprise the comparator circuit 300d of FIG. 14. Comparator circuit 300d comprises a two stage inverter. The output of the first inverter stage 302, 301 drives the gate of an enhancement mode transistor 306 connected in parallel with the pull-up component (a current source 305) of the second stage inverter 306, 307. Comparator circuit 300d may enhance the detection speed of the edge detection circuit and offer a better compromise between speed and power consumption. It will be understood that a similar two stage inverter using enhancement mode transistors in place of the depletion mode transistors 301, 307 may be used in a rising edge detection circuit.

In another implementation the output of the edge detection circuit may be configured as a current signal. In such an example the output signal from the edge detection circuit may be defined as the presence or absence of a low resistance path to ground from the node where the output of the active stage circuit is connected. These implementations may result in a higher power consumption if a node of the low resistance path to the ground can draw a significant current. An example of a comparator circuit 300e configured to provide an output current signal is shown in FIG. 15. In comparator circuit 300e an inverter circuit 302, 301 drives an enhancement mode transistor 304. When the enhancement mode transistor 304 is turned on the $V_{out}$ node has a low impedance path to the ground, and similarly the $V_{out}$ node does not have a low impedance path to the ground when the enhancement mode transistor 304 is turned off.

A similar implementation is illustrated in FIGS. 16A and B, in which comparator circuits 300f, 300g comprise depletion/enhancement mode transistors 301, 303 respectively which are driven by the output of the passive differentiator circuit directly. In these implementations, the depletion/enhancement mode transistors 301, 303 may or may not offer a low impedance path to ground depending on the output signal of the passive differentiator circuit.

It will be understood that further alternative implementations for the voltage reference, passive differentiator and comparator circuits may be provided within the scope of the present invention. For example, in addition to or in place of the inverter circuits described above, the comparator circuit of the edge detection circuit may comprise a voltage or current buffer amplifier.

In another example, the edge detection circuit may comprise a comparator circuit with a fixed reference voltage $V_{ref2}$, such as comparator circuit 300*h* of FIG. 17A. The reference voltage $V_{ref2}$ may be applied externally or generated on chip, or applied by any other suitable means. Beneficially, the reference voltage $V_{ref2}$ can be set at different levels, and its value is not controlled by or linked to a threshold voltage of a transistor used in an inverter circuit.

Figure 17B:
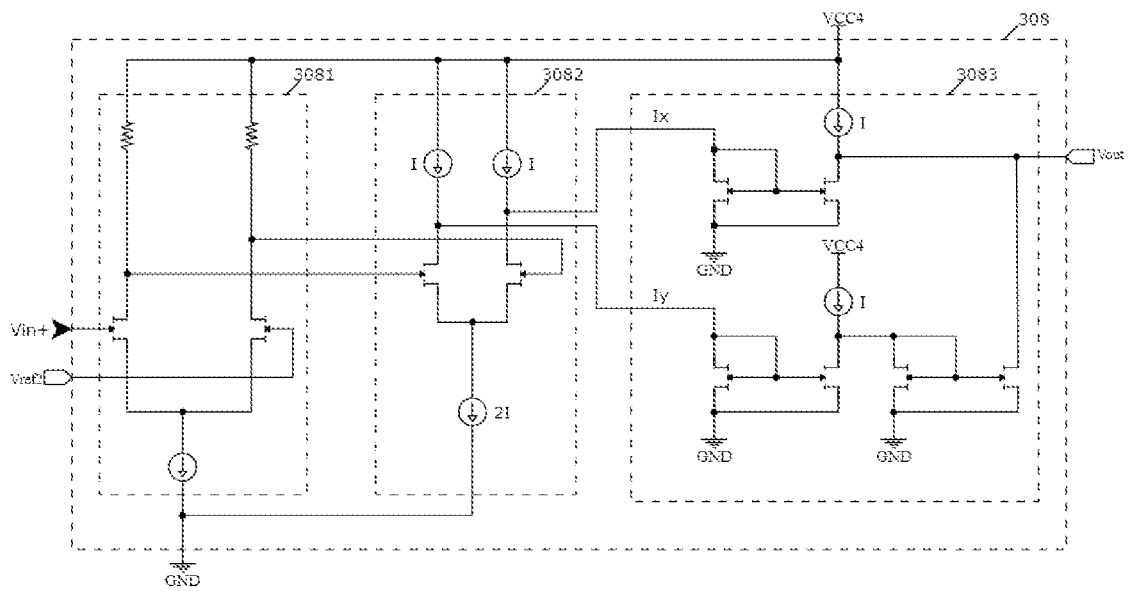
Figure 17C:
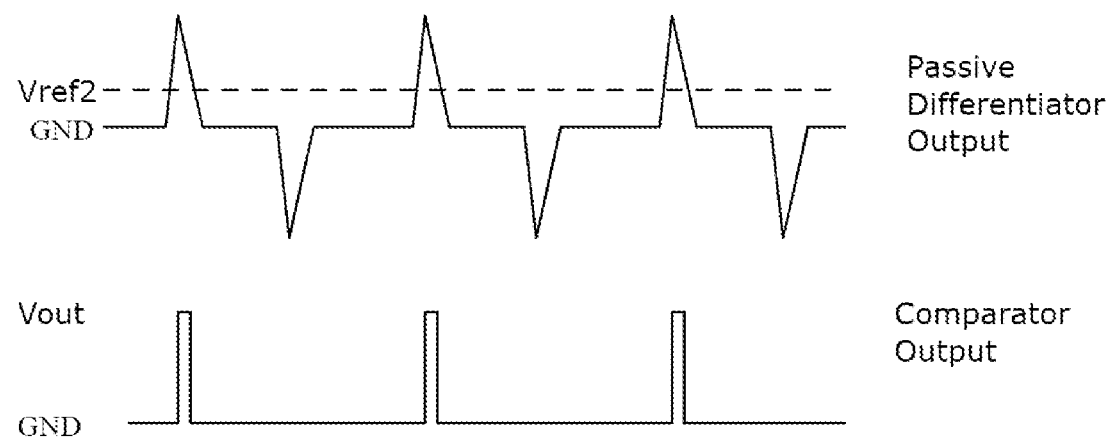

An example of a comparator circuit 300*h* is illustrated in FIG. 17B. The comparator circuit receives the passive differentiator output as an input signal $V_{in+}$. Additionally, it comprises a fixed reference voltage $V_{ref2}$ and a fixed voltage $V_{cc4}$, and provides an output $V_{out}$. The fixed voltages may be generated on chip or applied externally. The comparator circuit comprises an initial inverting differential amplifier stage 3081, a tranconductance amplifier stage 3082 and a current subtractor stage 3083.

Differential amplifier 3081 may be implemented using a differential pair (also known as long-tailed pair) comprising two enhancement mode transistors, two resistors and a current source. The differential amplifier generally performs two main functions in this circuit. It provides amplification of the comparator differential input signal ($V_{in+}-V_{ref2}$) and sets the bias point for the next stage, biasing the transconductance amplifier stage 3082 in a high gain region.

The transconductance amplifier 3082 receives a differential input voltage from the differential amplifier 3081 and provides a differential current output (lx, ly) to the current subtractor stage 3083. The transconductance amplifier comprises a differential pair with two enhancement mode transistors and current sources.

The current subtractor stage may be implemented using current mirroring blocks such that when Ix-ly is negative then $V_{out}$ is high, when lx-ly is positive then $V_{out}$ is low.

The transconductance amplifier stage and current subtractor stage allow a rail-to-rail comparator output. Rail-to-rail in this example refers to $V_{cc4}$ as a high output and ground reference as a low output.

FIG. 17C illustrates an example input and output signal for the comparator implementation illustrated in FIG. 17B. In this example, a positive reference voltage, $V_{ref2}$ is provided, and acts as the threshold voltage of the comparator circuit 302. This means that the positive reference voltage comparator circuit 300*h* selects a rising edge from the input signal, such that edge detection circuits comprising the positive threshold comparator circuit 300*h* are rising edge detection circuits. In the implementation of FIG. 17B the transition in the output signal $V_{out}$ is from low output to high output when a rising signal is detected. The comparator example illustrated in FIG. 17B generally operates in a similar manner to the comparator circuit 300*c* illustrated in FIG. 13A, with the comparator circuit 300*c* operating based on the threshold voltage of the enhancement mode transistor 303 instead of an applied reference voltage, $V_{ref2}$. The use of an applied reference voltage as the threshold voltage improves the adjustability of the edge detection circuit, as the threshold voltage may be changed to a desired level by adjusting $V_{ref2}$.

Other considerations for the choice of a suitable comparator circuit are for example power dissipation, area on wafer, common mode rejection ratio, response time.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in any embodiments, whether alone or in any appropriate combination with any other feature disclosed or illustrated herein.

The invention claimed is:

1. An edge detection circuit configured to receive an input signal comprising one or more falling edges and provide an output signal comprising pulses or spikes corresponding to the one or more falling edges, wherein the edge detection circuit comprises:
   a passive differentiator circuit configured to receive an input and provide a differentiator output signal that that is proportional to the rate of change of the input; and
   a comparator circuit operably connected to a voltage source, wherein the comparator circuit is configured to:
      receive the differentiator output signal;
      compare the differentiator output signal to a threshold voltage; and
      output a pulse or spike signal when the differentiator output signal is less than the threshold voltage;
   wherein the edge detection circuit is at least partially monolithically integrated with a Miller clamp and a power transistor; and
   wherein:
      the output signal of the edge detection circuit is configured to control the state of the Miller clamp; and
      the input signal of the edge detection circuit is a gate control signal from a controller or a gate driver.

2. The edge detection circuit of claim 1, wherein the edge detection circuit comprises a voltage reference circuit, and wherein the edge detection circuit is configured to provide a voltage reference output signal as the input to the passive differentiator circuit.

3. The edge detection circuit of claim 2, wherein voltage reference circuit is configured to:
   receive the input signal;
   compare the input signal to a set voltage reference; and
   output the voltage reference output signal based on the input signal, wherein the voltage reference output signal comprises a falling edge only when the input signal comprises a falling edge and the input signal is less than the set voltage reference.

4. The edge detection circuit of claim 3, wherein the voltage reference circuit comprises:
   a current source operably connected between an input terminal of the voltage reference circuit and an output terminal of the voltage reference circuit; and
   at least one source-gate connected transistor operably connected between the output terminal of the voltage reference circuit and a ground reference.

5. The edge detection circuit of claim 2, wherein voltage reference circuit is configured to:
   receive the input signal;
   compare the input signal to a set voltage reference; and output the voltage reference output signal based on the input signal, wherein the voltage reference output signal comprises a falling edge only when the input signal comprises a falling edge and the input signal is greater than the set voltage reference.

6. The edge detection circuit of claim 5, wherein the voltage reference circuit comprises at least one source-gate connected transistor operably connected in series between an input terminal of the voltage reference circuit and an output terminal of the voltage reference circuit.

7. The edge detection circuit of claim 5, wherein the voltage reference circuit comprises an inverter circuit configured to drive an enhancement mode transistor, the enhancement mode transistor operably connected between the output terminal of the voltage reference circuit and a ground reference.

8. The edge detection circuit of claim 5, wherein the voltage reference circuit comprises:
a threshold multiplier operably connected in series between an input terminal of the voltage reference circuit and an output terminal of the voltage reference circuit; and
a current source operably connected between the output terminal of the voltage reference circuit and a ground reference.

9. The edge detection circuit of claim 2, wherein a rate of change of the voltage reference output signal is proportional to a rate of change of the input signal.

10. The edge detection circuit of claim 9, wherein the rate of change of the voltage reference output signal and the rate of change of the input signal have the same sign.

11. The edge detection circuit of claim 1, wherein the passive differentiator circuit is configured such that the differentiator output signal has the same sign as the rate of change of the first input.

12. The edge detection circuit of claim 1, wherein the passive differentiator circuit comprises:
a capacitor operably connected between an input terminal of the passive differentiator circuit and an output terminal of the passive differentiator circuit; and
a resistor operably connected between the output terminal of the passive differentiator circuit and a ground reference.

13. The edge detection circuit of claim 1, wherein the comparator circuit comprises an inverter stage, the inverter stage comprising at least one depletion mode transistor and a pull-up component.

14. An edge detection circuit configured to receive an input signal comprising one or more falling edges and provide an output signal comprising pulses or spikes corresponding to the one or more falling edges, wherein the edge detection circuit comprises:
a passive differentiator circuit configured to receive an input and provide a differentiator output signal that that is proportional to the rate of change of the input;
a comparator circuit operably connected to a voltage source, wherein the comparator circuit is configured to:
receive the differentiator output signal;
compare the differentiator output signal to a threshold voltage; and
output a pulse or spike signal when the differentiator output signal is less than the threshold voltage;
a voltage reference circuit comprising:
a current source operably connected between an input terminal of the voltage reference circuit and an output terminal of the voltage reference circuit; and
a threshold multiplier operably connected between the output terminal of the voltage reference circuit and a ground reference;
wherein the voltage reference circuit is configured to:
receive the input signal;
compare the input signal to a set voltage reference; and
output the voltage reference output signal based on the input signal, wherein the voltage reference output signal comprises a falling edge only when the input signal comprises a falling edge and the input signal is less than the set voltage reference; and
wherein the edge detection circuit is configured to provide a voltage reference output signal as the input to the passive differentiator circuit.

15. The edge detection circuit of claim 14, wherein a rate of change of the voltage reference output signal is proportional to a rate of change of the input signal.

16. The edge detection circuit of claim 14, wherein the passive differentiator circuit is configured such that the differentiator output signal has the same sign as the rate of change of the first input.

17. The edge detection circuit of claim 14, wherein the passive differentiator circuit comprises:
a capacitor operably connected between an input terminal of the passive differentiator circuit and an output terminal of the passive differentiator circuit; and
a resistor operably connected between the output terminal of the passive differentiator circuit and a ground reference.

18. The edge detection circuit of claim 14, wherein the comparator circuit comprises an inverter stage, the inverter stage comprising at least one depletion mode transistor and a pull-up component.

19. An edge detection circuit configured to receive an input signal comprising one or more falling edges and provide an output signal comprising pulses or spikes corresponding to the one or more falling edges, wherein the edge detection circuit comprises:
a passive differentiator circuit configured to receive an input and provide a differentiator output signal that that is proportional to the rate of change of the input; and
a comparator circuit operably connected to a voltage source, wherein the comparator circuit is configured to:
receive the differentiator output signal;
compare the differentiator output signal to a threshold voltage; and
output a pulse or spike signal when the differentiator output signal is less than the threshold voltage;
wherein the threshold voltage is defined by a comparator reference voltage, and wherein the comparator circuit comprises one or more of:
a differential amplifier stage configured to receive an input based on a difference between the differentiator output signal and the comparator reference voltage and output a differential amplifier output signal;
a transconductance amplifier stage configured to receive the differential amplifier output signal and output a differential current output; and
a current subtractor stage configured to receive the differential current output; and
wherein comparing the differentiator output signal to a threshold voltage comprises the current subtractor setting the comparator output based on a sign of a current subtraction of two currents of the differential current output.

20. The edge detection circuit of claim 19, wherein one or both of:

the differential amplifier stage and transconductance amplifier stage comprise at least one differential pair; and the current subtractor stage comprises at least one current-mirror.

* * * * *